US012456696B2

(12) United States Patent
Chang et al.

(10) Patent No.: US 12,456,696 B2
(45) Date of Patent: Oct. 28, 2025

(54) DUMMY STACKED STRUCTURES SURROUNDING TSVS AND METHOD FORMING THE SAME

(71) Applicant: Taiwan Semiconductor Manufacturing Co., Ltd., Hsinchu (TW)

(72) Inventors: Mingni Chang, Hsinchu (TW); Yun-Chin Tsou, Hsinchu (TW); Ching-Jing Wu, Zaoqiao Township (TW); Shiou-Fan Chen, Hsinchu (TW); Ming-Yih Wang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 18/663,878

(22) Filed: May 14, 2024

(65) Prior Publication Data

US 2024/0304571 A1     Sep. 12, 2024

Related U.S. Application Data

(62) Division of application No. 17/464,903, filed on Sep. 2, 2021, now Pat. No. 12,014,997.

(Continued)

(51) Int. Cl.
*H01L 23/58* (2006.01)
*H01L 21/768* (2006.01)
(Continued)

(52) U.S. Cl.
CPC ...... *H01L 23/585* (2013.01); *H01L 21/76802* (2013.01); *H01L 21/76877* (2013.01);
(Continued)

(58) Field of Classification Search
CPC ............ H01L 23/585; H01L 21/76802; H01L 21/76877
See application file for complete search history.

(56) References Cited

U.S. PATENT DOCUMENTS 9,058,460 B2 *  6/2015  Daley ................. G06F 30/394
9,786,580 B2 * 10/2017  Yang ..................... H01L 25/50
(Continued)

FOREIGN PATENT DOCUMENTS

CN       105263393 A  *  1/2016  ......... A61B 1/00154
CN       113594088 A  * 11/2021  ........... H01L 23/481
(Continued)

*Primary Examiner* — Laura M Menz
(74) *Attorney, Agent, or Firm* — Slater Matsil, LLP

(57) ABSTRACT

A method includes forming a plurality of low-k dielectric layers over a semiconductor substrate, forming a first plurality of dummy stacked structures extending into at least one of the plurality of low-k dielectric layers, forming a plurality of non-low-k dielectric layers over the plurality of low-k dielectric layers, and forming a second plurality of dummy stacked structures extending into the plurality of non-low-k dielectric layers. The second plurality of dummy stacked structures are over and connected to corresponding ones of the first plurality of dummy stacked structures. The method further includes etching the plurality of non-low-k dielectric layers, the plurality of low-k dielectric layers, and the semiconductor substrate to form a via opening. The via opening is encircled by the first plurality of dummy stacked structures and the second plurality of dummy stacked structures. The via opening is then filled to form a through-via.

20 Claims, 25 Drawing Sheets

Related U.S. Application Data

(60) Provisional application No. 63/217,341, filed on Jul. 1, 2021.

(51) Int. Cl.
  *H01L 23/48* (2006.01)
  *H01L 25/065* (2023.01)
  *H01L 23/522* (2006.01)

(52) U.S. Cl.
  CPC ...... *H01L 21/76898* (2013.01); *H01L 23/481* (2013.01); *H01L 25/0657* (2013.01); *H01L 23/5226* (2013.01); *H01L 2225/06544* (2013.01)

(56) References Cited

U.S. PATENT DOCUMENTS

| | | | |
|---|---|---|---|
| 9,847,276 B2 | 12/2017 | Kang et al. | |
| 10,535,636 B2* | 1/2020 | Hu | H01L 25/03 |
| 11,080,455 B1* | 8/2021 | Hu | G06F 30/394 |
| 11,239,205 B2* | 2/2022 | Hu | H01L 24/20 |
| 11,251,156 B2* | 2/2022 | Mueller | H01L 24/08 |
| 11,748,544 B2* | 9/2023 | Hu | H10D 89/10 |
| | | | 716/120 |
| 11,756,933 B2* | 9/2023 | Chen | H01L 24/09 |
| | | | 257/774 |
| 12,014,997 B2* | 6/2024 | Chang | H01L 21/76802 |
| 12,223,250 B2* | 2/2025 | Hu | H10D 89/10 |
| 2010/0190338 A1* | 7/2010 | Koike | H01L 23/481 |
| | | | 257/E21.597 |
| 2013/0320504 A1* | 12/2013 | Lee | H01L 23/481 |
| | | | 257/E23.079 |
| 2014/0167286 A1 | 6/2014 | Ochiai | |
| 2015/0137382 A1* | 5/2015 | Yang | H01L 21/76898 |
| | | | 257/774 |
| 2015/0137388 A1* | 5/2015 | Kim | H01L 23/481 |
| | | | 257/774 |
| 2016/0133518 A1 | 5/2016 | Kuo | |
| 2016/0268183 A1* | 9/2016 | Yang | H10D 89/10 |
| 2018/0012825 A1* | 1/2018 | Yang | H01L 25/50 |
| 2019/0067157 A1* | 2/2019 | Lin | H01L 23/433 |
| 2019/0148342 A1* | 5/2019 | Hu | H01L 25/105 |
| | | | 257/659 |
| 2020/0075075 A1 | 3/2020 | Chen | |
| 2020/0105586 A1 | 4/2020 | Hsu | |
| 2020/0152608 A1* | 5/2020 | Hu | H01L 24/20 |
| 2020/0365514 A1* | 11/2020 | Yang | H01L 25/50 |
| 2021/0074697 A1 | 3/2021 | Baek | |
| 2021/0175143 A1* | 6/2021 | Yu | H01L 24/80 |
| 2021/0225722 A1* | 7/2021 | Kuo | H01L 24/19 |
| 2021/0280491 A1* | 9/2021 | Lin | H01L 23/3675 |
| 2022/0012402 A1* | 1/2022 | Hu | G06F 30/392 |
| 2022/0020675 A1* | 1/2022 | Chen | H01L 21/7684 |
| 2022/0139885 A1* | 5/2022 | Hu | H01L 24/05 |
| | | | 257/659 |
| 2022/0223564 A1* | 7/2022 | Chen | H01L 25/105 |
| 2022/0262768 A1* | 8/2022 | Chen | H01L 23/3135 |
| 2022/0301973 A1* | 9/2022 | Yu | H01L 24/94 |
| 2022/0367418 A1* | 11/2022 | Chen | H01L 23/16 |
| 2023/0005847 A1* | 1/2023 | Chang | H01L 21/76802 |
| 2023/0031333 A1* | 2/2023 | Chen | H10D 87/00 |
| 2023/0154837 A1* | 5/2023 | Sung | H01L 21/76898 |
| | | | 257/668 |
| 2023/0326825 A1* | 10/2023 | Yu | H01L 24/80 |
| | | | 257/706 |
| 2023/0351086 A1* | 11/2023 | Hu | H10D 89/10 |
| 2024/0304571 A1* | 9/2024 | Chang | H01L 25/0657 |
| 2024/0395619 A1* | 11/2024 | Lee | H01L 21/76897 |
| 2025/0022812 A1* | 1/2025 | Ryu | H01L 25/18 |
| 2025/0062227 A1* | 2/2025 | Liu | H01L 23/5283 |

FOREIGN PATENT DOCUMENTS

| | | | | |
|---|---|---|---|---|
| CN | 114464576 A | * | 5/2022 | ......... H01L 23/544 |
| CN | 115312450 A | * | 11/2022 | ......... H01L 23/481 |
| CN | 115810592 A | * | 3/2023 | ........ H01L 23/3677 |
| DE | 102022100834 A1 | * | 1/2023 | ....... H01L 21/76877 |
| JP | 2007012894 A | | 1/2007 | |
| JP | 2014120504 A | | 6/2014 | |
| KR | 20150058778 A | | 5/2015 | |
| KR | 20230005732 A | * | 1/2023 | .......... H01L 23/481 |
| KR | 20230055838 A | * | 4/2023 | .......... H01L 23/481 |
| KR | 20150057787 A | | 5/2024 | |
| KR | 102757147 B1 | * | 1/2025 | ....... H01L 21/76802 |
| TW | 201732974 A | | 9/2017 | |

\* cited by examiner

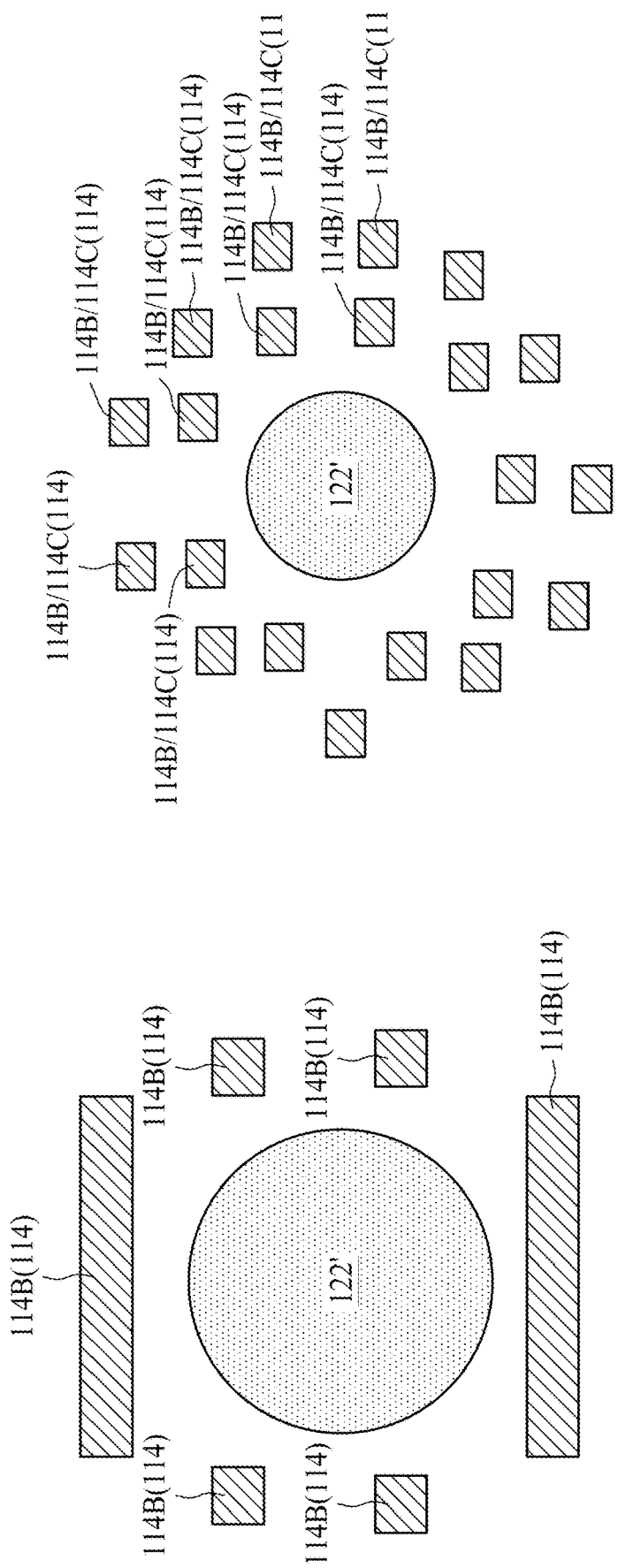

DUMMY STACKED STRUCTURES SURROUNDING TSVS AND METHOD FORMING THE SAME

PRIORITY CLAIM AND CROSS-REFERENCE

This application is a divisional of U.S. patent application Ser. No. 17/464,903, filed Sep. 2, 2021, and entitled "Dummy Stacked Structures Surrounding TSVS and Method Forming the Same," which claims the benefit of the U.S. Provisional Application No. 63/217,341, filed on Jul. 1, 2021, and entitled "Stacked metallic Structures Surrounding TSV," which applications are hereby incorporated herein by reference.

BACKGROUND

Through-Silicon Vias (TSVs) are used as electrical paths in device dies, so that the conductive features on opposite sides of the device dies may be interconnected. The formation process of a TSV includes etching a semiconductor substrate to form an opening, filling the opening with a conductive material to form the TSV, performing a backside grinding process to remove a portion of the semiconductor substrate from backside, and forming an electrical connector on the backside of the semiconductor substrate to connect to the TSV.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 18-27 illustrate the top views of through-vias and dummy stacked structures in accordance with some embodiments.

DETAILED DESCRIPTION

Figure 1:
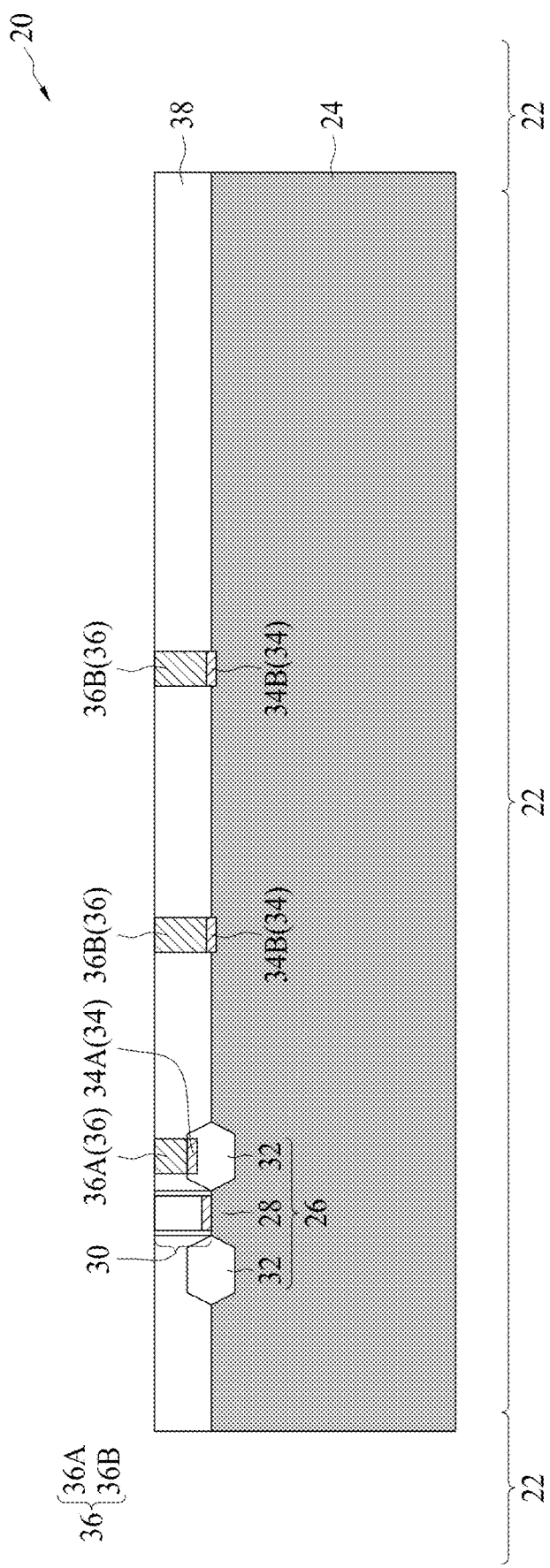
FIGS. 1-15 illustrate the cross-sectional views of intermediate stages in the formation of dies including through-vias and dummy stacked structures in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A die including through-vias, dummy stacked structure, and the method of forming the same are provided in accordance with some embodiments. The through-vias penetrate through a substrate and a plurality of dielectric layers over the substrate. The dummy stacked structures may be formed encircling the through-substrate vias. The dummy stacked structures are formed in the dielectric layers, and function as tunnels for outgassing moisture from the through-via openings during a baking process. The intermediate stages in the formation of the die are illustrated in accordance with some embodiments. Some variations of some embodiments are discussed. Throughout the various views and illustrative embodiments, like reference numbers are used to designate like elements.

Figure 28:
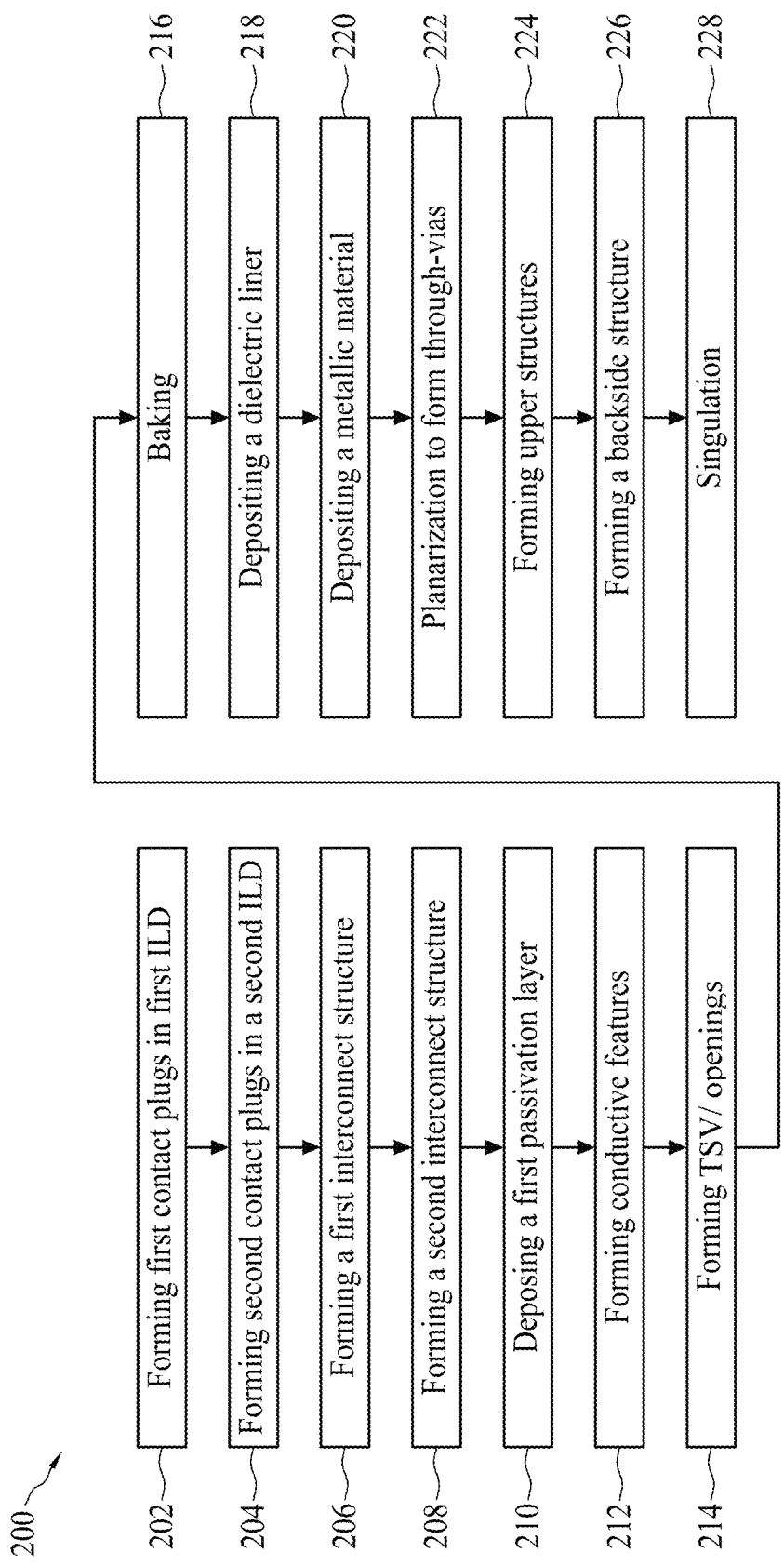
FIG. 28 illustrates a process flow for forming a die comprising through-vias and dummy stacked structures in accordance with some embodiments.

FIGS. 1-15 illustrate the cross-sectional views of intermediate stages in the formation of a die including through-vias and dummy stacked structures in accordance with some embodiments of the present disclosure. The corresponding processes are also reflected schematically in the process flow 200 as shown in FIG. 28.

FIG. 1 illustrates a cross-sectional view of wafer 20. In accordance with some embodiments of the present disclosure, wafer 20 is or comprises a device wafer including active devices and possibly passive devices, which are represented as integrated circuit devices 26. Wafer 20 may include a plurality of chips/dies 22 therein, with one of chips 22 being illustrated. In accordance with alternative embodiments of the present disclosure, wafer 20 is an interposer wafer, which is free from active devices, and may or may not include passive devices.

In accordance with some embodiments of the present disclosure, wafer 20 includes semiconductor substrate 24 and the features formed at a top surface or an active surface of semiconductor substrate 24. Semiconductor substrate 24 may be formed of or comprise crystalline silicon, crystalline germanium, silicon germanium, carbon-doped silicon, a III-V compound semiconductor such as GaAsP, AlInAs, AlGaAs, GaInAs, GaInP, GaInAsP, or the like. Shallow Trench Isolation (STI) regions (not shown) may be formed in semiconductor substrate 24 to isolate the active regions in semiconductor substrate 24.

Integrated circuit devices 26 may include transistors, resistors, capacitors, diodes, and the like in accordance with some embodiments. In accordance with alternative embodiments, wafer 20 is used for forming interposers (which are free from active devices), and substrate 24 may be a semiconductor substrate or a dielectric substrate.

Transistor 28, which is a part of integrated circuit devices 26, is illustrated to represent integrated circuit devices 26. In accordance with some embodiments, transistor 28 includes gate stack 30, source/drain regions 32 aside of gate stack 30, source/drain silicide region 34A, and source/drain contact plug 36A. Transistor 28 may be a planar transistor, a Fin Field-Effect (FinFET) transistor, a nano-sheet transistor, a nanowire transistor, or the like. Dummy silicide regions 34B and dummy contact plugs 36B are also formed on semiconductor substrate 24. In accordance with some embodiments, dummy silicide regions 34B and source/drain silicide region 34A are formed in common formation processes. Source/drain contact plug 36A and dummy contact plug 36B may also be formed in common formation processes. The respective process is illustrated as process 202 in the process flow 200 as shown in FIG. 28. Throughout the description, source/drain contact plug 36A and dummy contact plug 36B are collectively referred to as contact plugs 36.

Inter-Layer Dielectric (ILD) 38 is formed over semiconductor substrate 24, with the gate stacks of the transistors (such as gate stack 30) and source/drain contact plugs (such as 36A) being formed in integrated circuit devices 26. In accordance with some embodiments, ILD 38 is formed of silicon oxide, Phospho Silicate Glass (PSG), Boro Silicate Glass (BSG), Boron-doped Phospho Silicate Glass (BPSG), Fluorine-doped Silicate Glass (FSG), or the like. The dielectric constant (k) value of ILD 38 may be greater than about 3.0. ILD 38 may be formed using spin coating, Flowable Chemical Vapor Deposition (FCVD), or the like. In accordance with some embodiments of the present disclosure, ILD 38 may also be formed using a deposition method such as Plasma Enhanced Chemical Vapor Deposition (PECVD), Low Pressure Chemical Vapor Deposition (LPCVD), or the like.

In accordance with some embodiments of the present disclosure, source/drain contact plug 36A (which is also referred to as an active contact plug) and dummy contact plug 36B are formed of or comprise a conductive material selected from tungsten, cobalt, aluminum, copper, titanium, tantalum, titanium nitride, tantalum nitride, alloys therefore, and/or multi-layers thereof. The formation of source/drain contact plug 36A and dummy contact plug 36B may include forming contact openings in ILD 38, filling a conductive material(s) into the contact openings, and performing a planarization process (such as a Chemical Mechanical Polish (CMP) process or a mechanical grinding process) to level the top surfaces of source/drain contact plug 36A and dummy contact plug 36B with the top surface of ILD 38.

FIGS. 2 through 6 illustrate the formation of a plurality of dielectric layers and a plurality of layers of contact plugs, metal lines, vias, and the like. It is appreciated that the illustrated structure are examples, and different layer schemes may be adopted. For example, there may be different numbers of contact plugs, metal lines, ILD layers, low-k dielectric layers, non-low-k dielectric layers, etc., than the discussed example embodiments.

Figure 2:
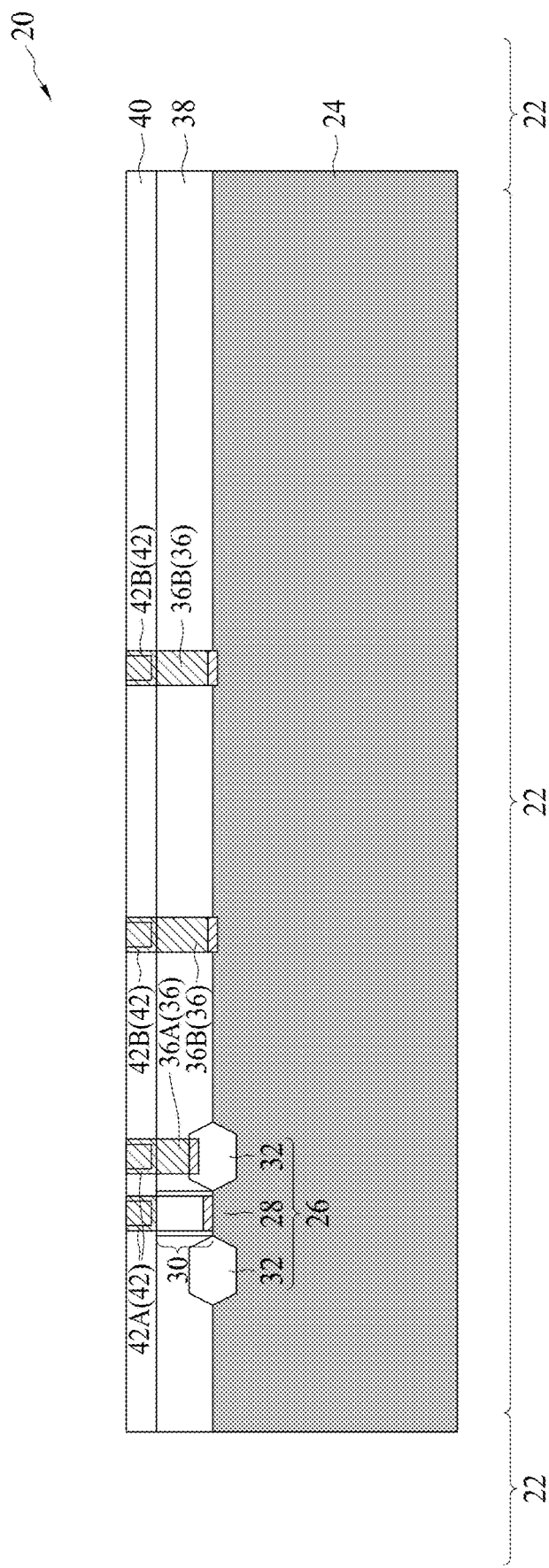

FIG. 2 illustrates the formation of ILD 40, active contact plugs 42A, and dummy contact plugs 42B. The respective process is illustrated as process 204 in the process flow 200 as shown in FIG. 28. Throughout the description, the term "active" refers to the features that are electrically coupled to integrated circuit devices and have electrical functions, and the term "dummy" refers to the features that do not have electrical functions, and are not used for conducting currents. Throughout the description, source/drain contact plug 42A and dummy contact plug 42B are collectively referred to as contact plugs 42. ILD 40 may be formed of a dielectric material selected from the same group of candidate materials for forming ILD 38. ILD 40 may have a non-low-k value in accordance with some embodiments, while it may also have a k value in the range between about 3.0 and about 3.8, or higher. There may be, or may not be, an etch stop layer (not shown) between ILD 38 and ILD 40.

Contact plugs 42 may also be formed of similar materials and have similar structures as that of source/drain contact plug 36. The formation process of contact plugs 42 may also include forming contact openings in ILD 40, filling a conductive material(s) into the contact openings, and performing a planarization process to level the top surfaces of contact plugs 42 with the top surface of ILD 40. Contact plugs 42A and dummy contact plugs 42B are formed simultaneously and share common formation processes.

Figure 3:
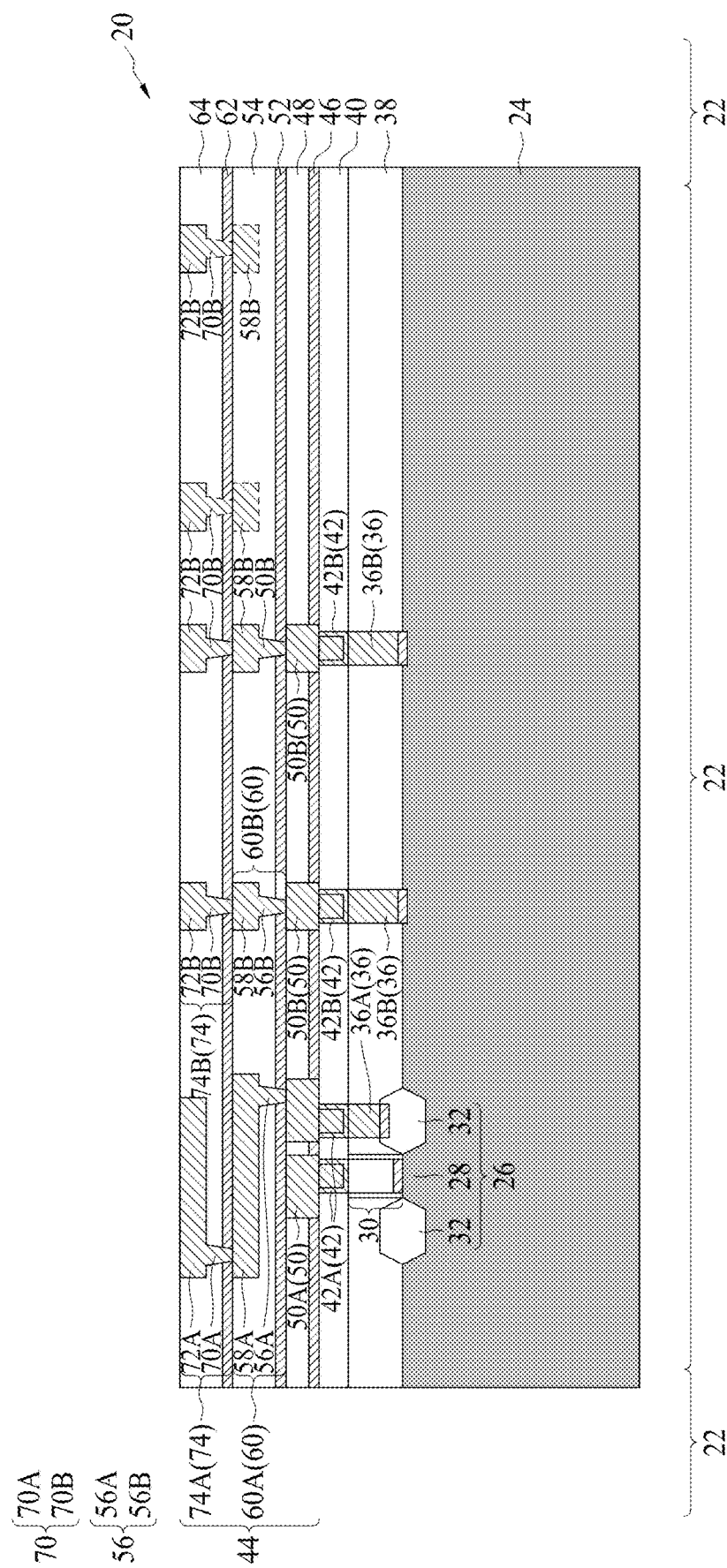

Referring to FIG. 3, interconnect structure 44 is formed over ILD 40 and contact plugs 42. The respective process is illustrated as process 206 in the process flow 200 as shown in FIG. 28. Throughout the description, interconnect structure 44 refers to the interconnect structure formed based on low-k dielectric layers. Interconnect structure 44 may include etch stop layer 46 and dielectric layer 48, and metal lines 50 in etch stop layers 46 and dielectric layer 48. The metal lines 50 may be collectively referred to as metal layer M0.

The formation of metal lines 50 in dielectric layer 48 and etch stop layer 46 may include single damascene processes. Metal lines 50 may include metal lines 50A and dummy metal lines 50B formed simultaneously in common processes. In a single damascene process for forming the metal line, trenches (occupied by metal lines 50) are first formed in dielectric layer 48 and etch stop layer 46, followed by filling the trenches with conductive materials, which may include a conformal barrier layer and a metallic material. The barrier layer may be formed of titanium, titanium nitride, tantalum, tantalum nitride, or the like. The metallic material may include copper, a copper alloy, tungsten, cobalt, or the like. A planarization process such as a CMP process is then performed to remove the excess portions of the conductive material higher than the top surface of the dielectric layer, leaving metal lines 50 in dielectric layer 48 and etch stop layer 46. Metal lines 50 include active metal lines 50A and dummy metal lines 50B.

Etch stop layer 52 and dielectric layer 54 are then formed through deposition. Vias 56 and metal lines 58 (which are collectively referred to as dual damascene structures 60) are formed in dielectric layer 54 and etch stop layer 52. Vias 56 include active vias 56A and dummy vias 56B. Metal lines 58 include active metal lines 58A and dummy metal lines 58B. The metal lines 58 may be collectively referred to as metal layer M1. Dual damascene structures 60 may include active dual damascene structures 60A and dummy dual damascene structures 60B, which are formed simultaneously in common processes.

Etch stop layer 62 and dielectric layer 64 are then formed through deposition over dielectric layer 54. Vias 70 and metal lines 72 (which are collectively referred to as dual damascene structures 74) are formed in dielectric layer 64 and etch stop layer 62. The metal lines 72 may be collectively referred to as metal layer M2. Vias 70 include active vias 70A and dummy vias 70B. Metal lines 72 include active metal lines 72A and dummy metal lines 72B. Dual damascene structures 74 may include active dual damascene structures 74A and dummy dual damascene structures 74B, which are formed simultaneously in common processes.

In a dual damascene process for forming dual damascene structures 60, both of trenches and via openings are formed in dielectric layer 54, with the via openings underlying and connected to the trenches. In an example embodiment, the formation process may include forming a hard mask (not shown) over dielectric layer 54, with the trenches formed in the hard mask. A photo resist having via patterns is then formed, followed by etching electric layer 54 to form via openings, wherein the via openings extend to an intermediate level between a top surface and a bottom surface of dielectric layer 54. The photo resist is then removed. Dielectric layer 54 is then etched using the hard mask as the etching mask. Trenches (occupied by metal lines 58) are thus formed in the dielectric layer 54. At the same time the trenches are formed, via openings extend down to the bottom of dielectric layer 54, exposing the underlying etch stop layer 52. Etch stop layer 52 is then etched to expose the underlying conductive features such as metal lines 50. The trenches and the via openings are then filled with conductive materials, which may include a conformal barrier layer and a metallic material, similar to what are adopted for the single damascene process. A planarization process is then performed to form the metal lines 58 and vias 56. Dual damascene structures 74 may be formed using similar processes and similar materials, and may adopt the similar processes, as the formation of dual damascene structures 60.

Etch stop layers 46, 52, and 62 may include silicon nitride (SiN), silicon carbide (SiC), silicon oxy-nitride (SiON), silicon oxy-carbide (SiOC), silicon Carbo-nitride (SiCN), or the like. Etch stop layers 46, 52, and 62 may also include a metal oxide, a metal nitride, or the like. Each of etch stop layers 46, 52, and 62 may be single layer formed of a homogeneous material, or a composite layer including a plurality of dielectric sub-layers formed of different materials. In accordance with some embodiments of the present disclosure, one or more of layers 46, 52, and 62 may include an aluminum nitride (AlN) layer, a silicon oxy-carbide layer over the aluminum nitride layer, and an aluminum oxide layer over the silicon oxy-carbide layer Dielectric layers 48, 54, and 64 are also referred to as Inter-metal Dielectrics (IMDs). In accordance with some embodiments of the present disclosure, the dielectric layers (including 48, 54, and 64) in interconnect structure 44 are formed of low-k dielectric materials. The dielectric constants (k values) of the low-k dielectric materials may be lower than about 3.2, and may be in the range between about 2.6 and about 32, for example. Dielectric layers 48, 54, and 64 may comprise a carbon-containing low-k dielectric material, Hydrogen SilsesQuioxane (HSQ), MethylSilsesQuioxane (MSQ), or the like. In accordance with some embodiments of the present disclosure, the formation of dielectric layers 48, 54, and 64 includes depositing a porogen-containing dielectric material(s) in the dielectric layers, and then performing a curing process to drive out the porogen, and hence the remaining dielectric layers 48, 54, and 64 are porous. Although three IMDs are illustrated as an example, interconnect structure 44 may include more dielectric layers (which are formed of low-k dielectric materials). For example, interconnect structure 44 may include 4 to 8 dielectric layers and corresponding metal layers.

Figure 4:
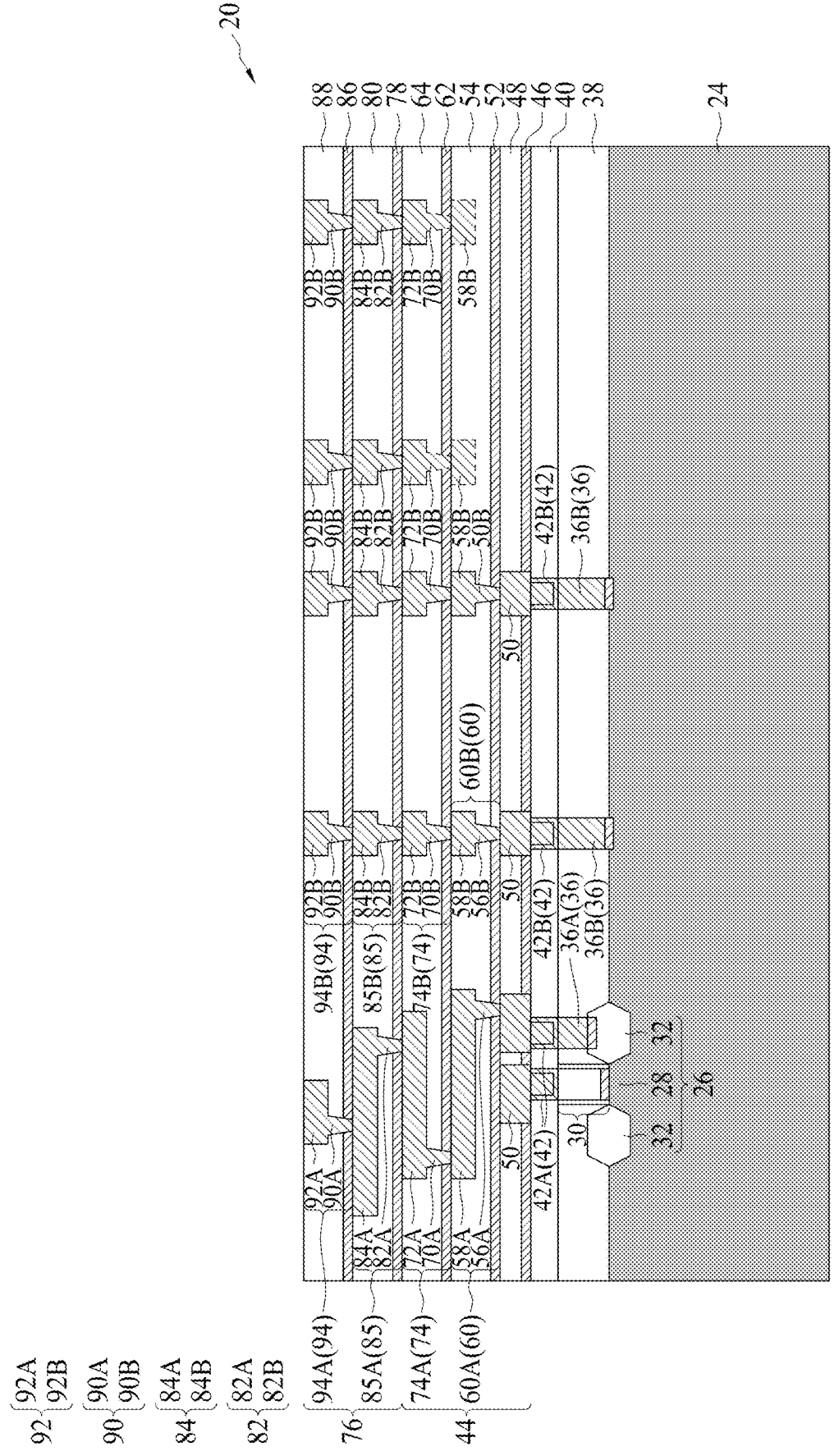

FIG. 4 illustrates the formation of interconnect structure 76, which also includes etch stop layers, dielectric layers over the corresponding etch stop layers, and damascene structures (metal lines and vias). The respective process is illustrated as process 208 in the process flow 200 as shown in FIG. 28. In accordance with some embodiments, unlike interconnect structure 44, the dielectric layers in interconnect structure 76 (such as dielectric layers 80 and 88) are formed of non-low-k dielectric materials, which may include silicon oxide, silicon nitride, silicon carbide, silicon oxynitride, silicon oxycarbide, or the like. In accordance with alternative embodiments, the formation of interconnect structure 76 is skipped, and the processes as shown in FIG. 5 and the subsequent process are performed directly on interconnect structure 44.

In accordance with some embodiments, interconnect structure 76 includes etch stop layer 78 and dielectric layer 80, which are formed through deposition processes. Vias 82 (including 82A and 82B) and metal lines 84 (including 84A and 84B) are formed in dielectric layer 80 and etch stop layer 78. Vias 82 and metal lines 84 are collectively referred to as dual damascene structures 85. Vias 82 include active vias 82A and dummy vias 82B. Metal lines 84 include active metal lines 84A and dummy metal lines 84B. Etch stop layer 86 and dielectric layer 88 are formed over dielectric layer 80 through deposition. Vias 90 and metal lines 92 (which are collectively referred to as dual damascene structures 94) are formed in dielectric layer 88 and etch stop layer 86. Vias 90 include active vias 90A and dummy vias 90B. Metal lines 92 include active metal lines 92A and dummy metal lines 92B. Interconnect structure 76 may include more dielectric layers (which are formed based on non-low-k dielectric materials) and metal lines and vias therein, which are not illustrated herein. For example, interconnect structure 76 may include 4 to 8 dielectric layers and corresponding metal layers.

Figure 5:
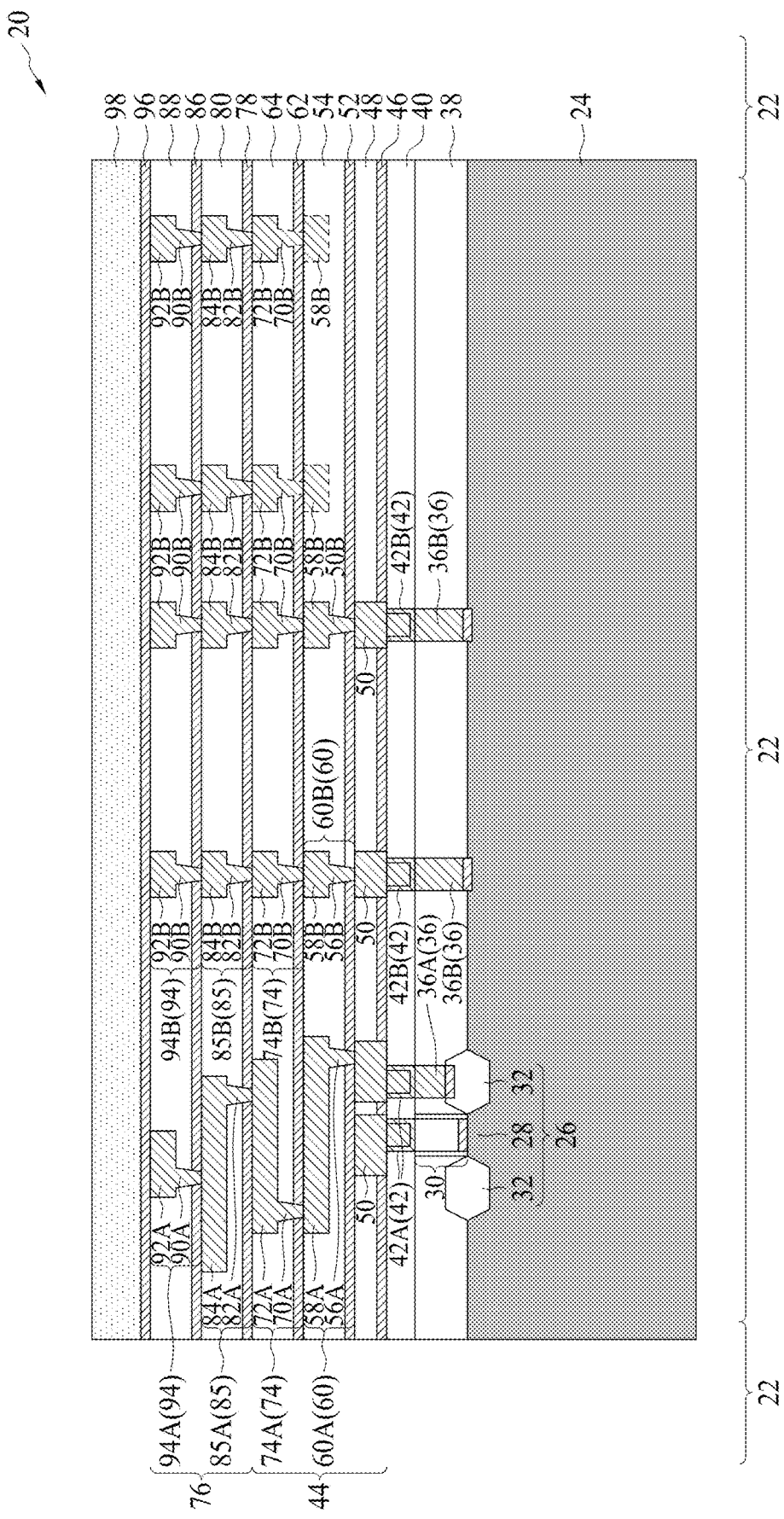

Referring to FIG. 5, etch stop layer 96 is deposited over interconnect structure 76. Etch stop layer 96 may be formed of or comprises aluminum oxide, aluminum nitride, silicon oxynitride, silicon oxide, silicon nitride, silicon carbide, silicon oxycarbide, or the like, or multi-layers thereof.

Passivation layer 98 (sometimes referred to as passivation-1 or pass-1) is formed over etch stop layer 96. The respective process is illustrated as process 210 in the process flow 200 as shown in FIG. 28. In accordance with some embodiments, passivation layer 98 is formed of a non-low-k dielectric material having a dielectric constant equal to or greater than the dielectric constant of silicon oxide. Passivation layer 98 may be formed of or comprise an inorganic dielectric material, which may include a material selected from, and is not limited to, Undoped Silicate Glass (USG), SiN, SiO$_2$, SiON, SiOC, SiC, or the like, combinations thereof, and/or multi-layers thereof.

Figure 6:
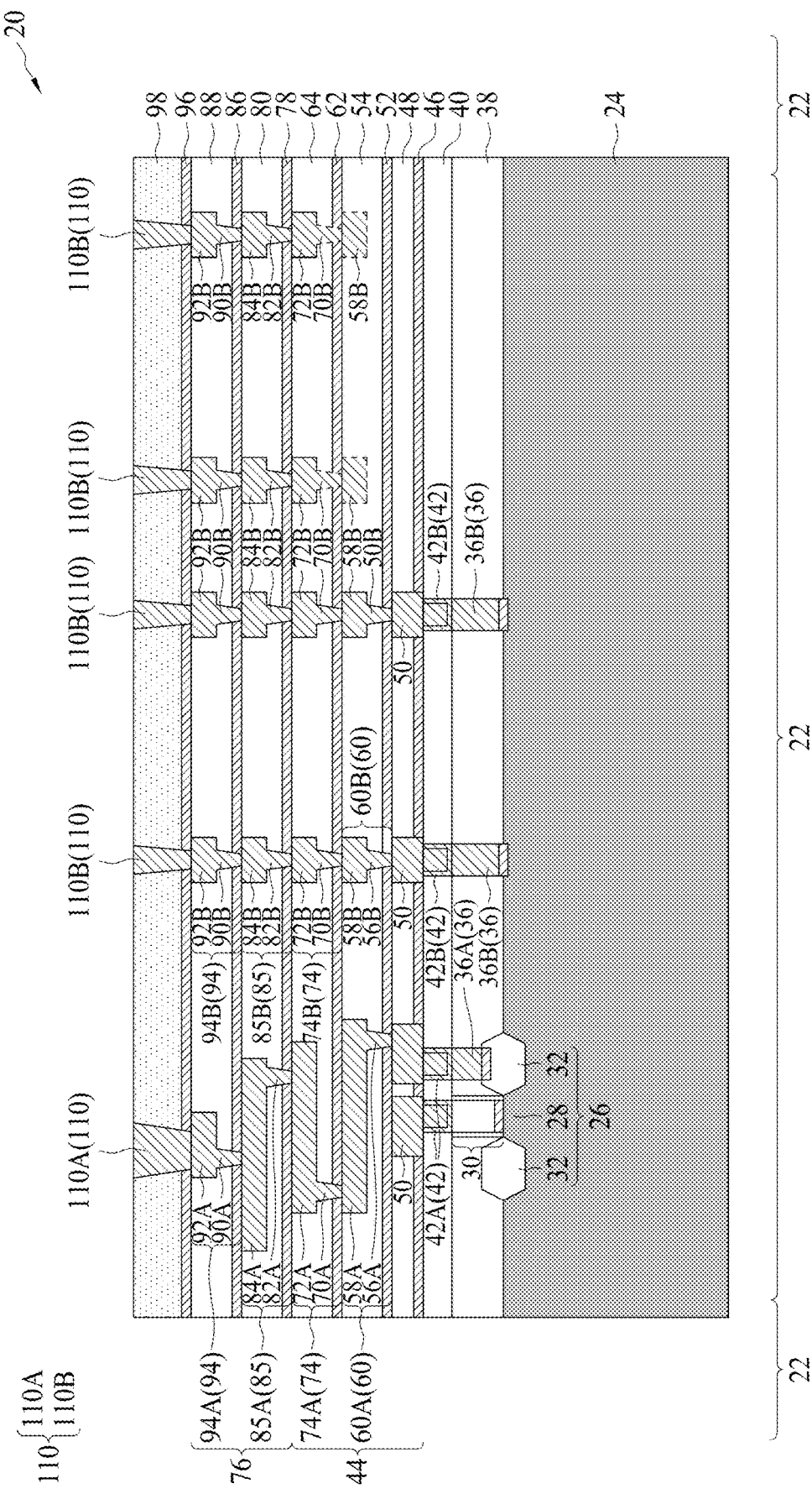
Figure 9:
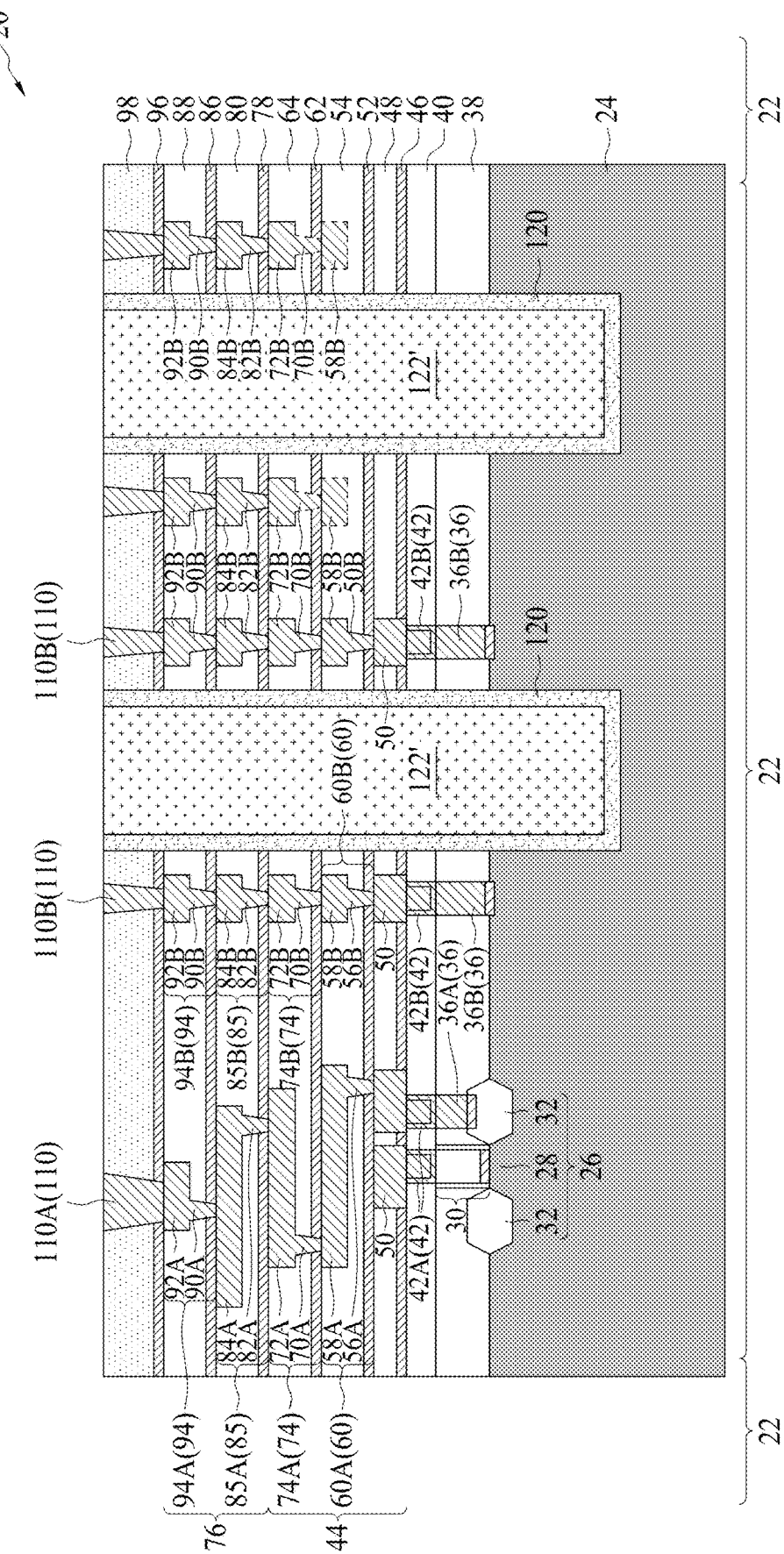

Referring to FIG. 6, conductive features 110 (including active conductive features 110A and dummy conductive features 110B) are formed to connect to the underlying active features and dummy features, respectively. The respective process is illustrated as process 212 in the process flow 200 as shown in FIG. 28. In accordance with some embodiments, conductive features 110 are formed through a single damascene process. The formation process may include etching passivation layer 98 and the underlying etch stop layer 96 to form openings, depositing a conductive barrier (formed of titanium, titanium nitride, tantalum, tantalum nitride, or the like, for example), and plating a conductive material such as copper, tungsten, or the like. A CMP process may then be performed to remove excess conductive material and conductive barrier, leaving conductive features 110. In accordance with alternative embodiments, instead of forming conductive features 110 at this stage, conductive features 110 may be formed after the formation of through-vias 122' as shown in FIG. 9.

Figure 7:
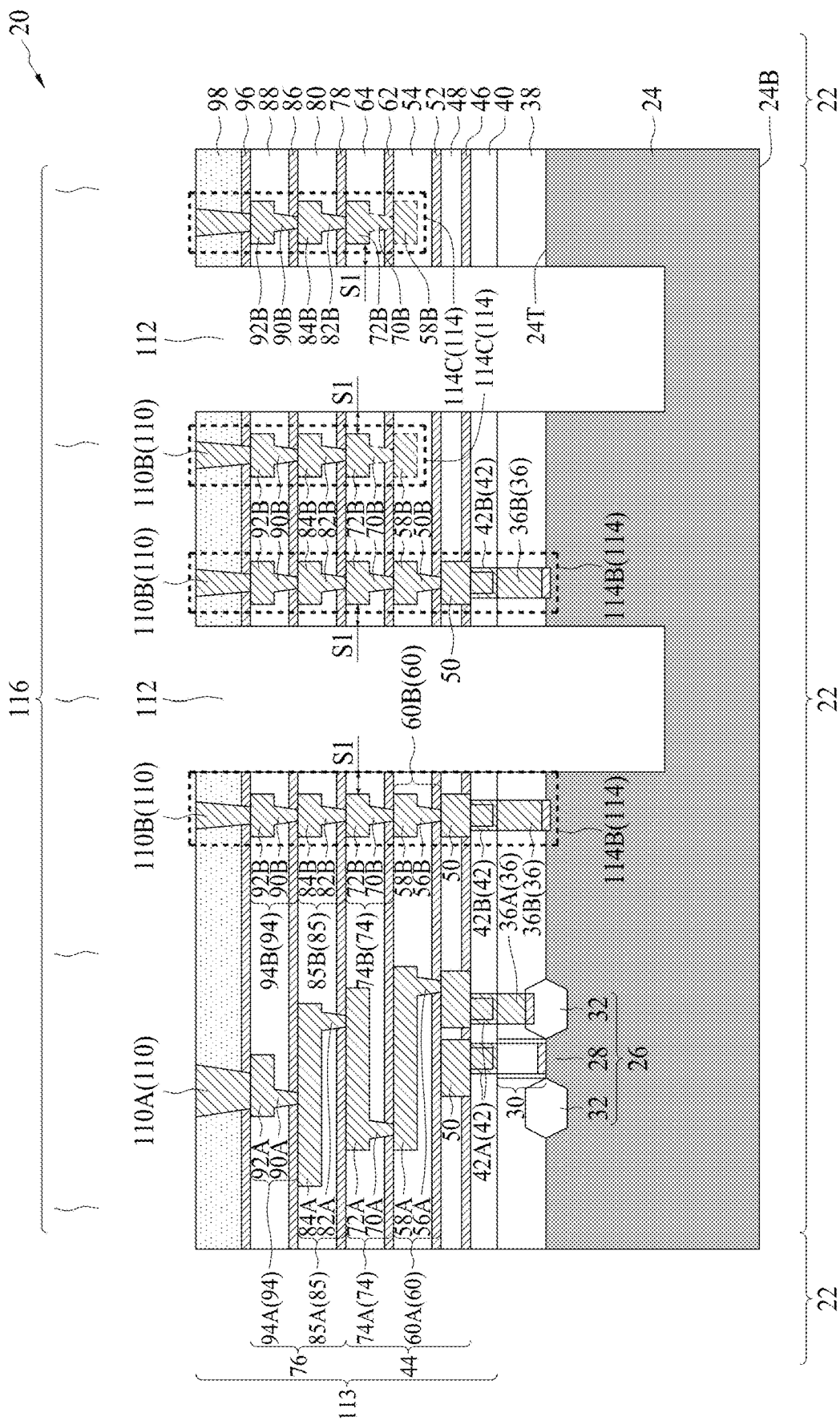

Referring to FIG. 7, a patterned etching mask (not shown) is formed over passivation layer 98. In accordance with some embodiments, the patterned etching mask comprises a photo resist, and may or may not include a hard mask formed of TiN, BN, or the like. An anisotropic etching process is then performed to form openings 112. The respective process is illustrated as process 214 in the process flow 200 as shown in FIG. 28. The resulting openings 112 penetrate through the dielectric layers in interconnect structures 76 and 44, and penetrate through ILDs 40 and 38, etc. Semiconductor substrate 24 is further etched so that openings 112 extend to an intermediate level of substrate 24, wherein the intermediate level is between the top surface 24T and the bottom surface 24B of semiconductor substrate 24. Openings 112 are used for forming Through-Semiconductor Vias (TSVs, also sometimes referred to as Through-Silicon Vias), and hence are referred to as TSV openings 112 hereinafter. The anisotropic etching process may include a plurality of etching processes, which adopt different etching gases in order to etch the dielectric layers that are formed of different materials, and to etch semiconductor substrate 24.

The above-discussed processes result in electrical connection structure 113, and dummy stacked structures 114B and 114C. Dummy stacked structures 114B and 114C are collectively referred to dummy stacked structures 114. Electrical connection structure 113 is used for electrically connecting to the integrated circuit devices 26, and when used, there are voltages and currents flowing therein. Dummy stacked structures 114B and 114C may not have electrical functions, and may not electrically connect to the integrated circuit devices 26. Each of dummy stacked structures 114B and 114C includes a plurality of conductive features, which are distributed in a plurality of dielectric layers. The plurality of conductive features are joined to form an integrated feature, which may extend from top of passivation layer 98 down into a level of interconnect structure 44 or below. The top-view shapes of dummy stacked structures 114B and 114C are shown in FIGS. 18 through 27. In accordance with some embodiments, dummy stacked structures 114B and 114C are electrically floating. In accordance with alternative embodiments, dummy stacked structures 114B and 114C are electrically grounded. For example, dummy stacked structures 114B, which are electrically connected to semiconductor substrate 24, may be electrically grounded. Partial dummy stacked structures 114C may be electrically grounded or electrically floating.

Dummy stacked structures include full dummy stacked structures 114B and partial dummy stacked structures 114C. The full dummy stacked structures 114B extend into all of the dielectric layers in which the subsequently formed through-vias extend into. For example, full dummy stacked structures 114B extend into each of the dielectric layers ranging from passivation layer 98 to ILD 38, and further extend into any dielectric layer between ILD 38 and semiconductor substrate 24. Partial dummy stacked structures 114C are example partial dummy stacked structures, which extend from passivation layer 98 downwardly, and the bottoms of the partial dummy stacked structures 114C are higher than the top surface of semiconductor substrate 24. Accordingly, partial dummy stacked structures 114C are vertically spaced apart from semiconductor substrate 24 by at least one or more dielectric layers.

In accordance with some embodiments, the partial dummy stacked structures 114C extend into at least one, and may be more, low-k dielectric layers in interconnect structure 44. For example, assuming the dielectric layers 48, 54, and 64 in interconnect structure 44 are low-k dielectric layers, and the dielectric layers (such as layers 80 and 88) in interconnect structure 76 are non-low-k dielectric layers, the partial dummy stacked structures 114C at least penetrate through all of the non-low-k dielectric layers in interconnect structure 76, and extend into at least the top low-k dielectric layer (for example, layer 64) in interconnect structure 44. This ensures effective moisture dissipation in the subsequent baking process 116 as shown in FIG. 7. It is appreciated that partial dummy stacked structure 114C may extend into and stop in any of the low-k dielectric layers such as low-k dielectric layer 64, 54, or 48, or may extend into and stop in ILD 40 or ILD 38 (assuming there is at least one dielectric layer between ILD 38 and semiconductor substrate 24). For example, in FIG. 7, metal lines/pads 58B and vias 70B are shown as being dashed, which represent that these features may or may not be formed. Furthermore, full dummy stacked structures 114B and partial dummy stacked structures 114C may be formed in the same die 22. In a same die 22, there may also be multiple partial dummy stacked structures 114C that extend into different low-k dielectric layers and ILD layers in any combination. For example, in one die, there may be a partial dummy stacked structures 114C extending into and stopping in low-k dielectric layer 48, a partial dummy stacked structures 114C extending into and stopping in low-k dielectric layer 54, a partial dummy stacked structures 114C extending into and stopping in low-k dielectric layer 64, and a full dummy stacked structures 114B.

The dielectric layers, particularly low-k dielectric layers, may absorb moisture in preceding processes, especially TSV processes. Since TSV size and depth are quite large and lower metal layer is capsulated, the moisture occurred during TSV process, such as the opening-etching process, is hardly to outgas in conventional structure. A baking process is thus performed to remove the moisture absorbed by the dielectric layers. The respective process is illustrated as process 216 in the process flow 200 as shown in FIG. 28. In accordance with some embodiments, the baking process is performed at a temperature in a range between about 300° C. and about 450° C. The baking duration may be in the range between about 30 minutes and about 120 minutes. During the baking process, the moisture is removed from the dielectric layers. In accordance with some embodiments, dummy stacked structures 114 function as the outgassing tunnels for dissipating the moisture to outer environment. Without the dummy stacked structures 114, the baking process is less effective in removing moisture. Furthermore, dummy stacked structures 114 may also function for blocking moisture from extending laterally from TSV openings 112 into inner parts of the dielectric layers. To allow dummy stacked structures 114 to function effectively for outgassing and blocking moisture, dummy stacked structures 114 are formed close to the TSV openings 112, For example, with spacings S1 being smaller than bout 1 μm, and may be in the range between about 0.2 μm and about 0.5 μm. Furthermore, the total top-view area $TA_{FD}$ of all full dummy stacked structures 114B surrounding a TSV opening 112 may be equal to or greater than the top-view area $TA_{TSV}$ of the TSV opening, so that the outgassing tunnels are large enough. Since the partial dummy stacked structures 114C are less effective in outgassing and blocking moisture, more partial dummy stacked structures 114C may be formed. For example, the total top-view area $TA_{PD}$ of all partial dummy stacked structures 114C surrounding a TSV opening 112 may be equal to or greater than 2 times the top-view area $TA_{TSV}$ of the TSV opening 112.

In accordance with some embodiments, as shown in FIG. 7, the baking process 116 is performed after the formation of TSV openings 112, and before the filling of TSV openings 112. In accordance with alternative embodiments, since dummy stacked structures 114B and 114C act as the vertical outgassing tunnels, the baking process may also be performed before the formation of TSV openings 112, such as performed on the structure shown in FIG. 6. In accordance with yet alternative embodiments, the baking process may also be performed after TSV openings 112 have been filled to form through-vias. For example, the baking process may be performed on the structure shown in FIG. 9.

Figure 8:
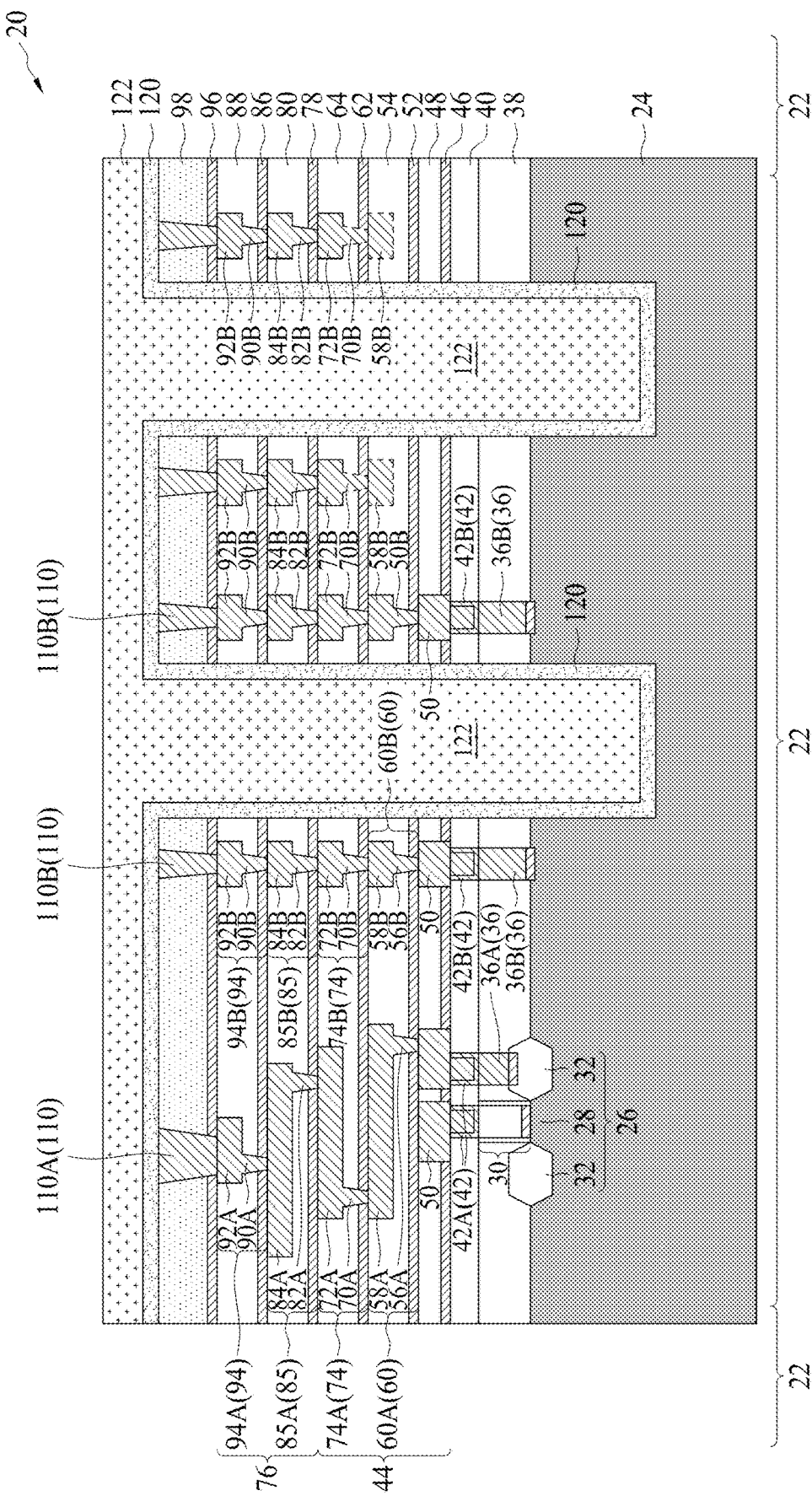

Referring to FIG. 8, dielectric liner 120 is deposited. The respective process is illustrated as process 218 in the process flow 200 as shown in FIG. 28. Dielectric liner 120 includes horizontal portions outside of TSV openings 112, and vertical portions extending into TSV openings 112. In accordance with some embodiments, dielectric liner 120 is formed of or comprises a dielectric material such as silicon nitride, silicon carbide, silicon oxynitride, silicon oxycarbide, or the like, or combinations thereof. The deposition method may include PECVD, Atomic Layer Deposition (ALD), Physical Vapor Deposition (PVD), or the like. In accordance with some embodiments, dielectric liner 120 has good ability for electrical isolation and diffusion prevention, and may prevent undesirable substances from penetrating through it.

Dielectric liner 120 may be a single-layer dielectric layer or a composite layer (including two or more sub layers). For example, the sub-layers in dielectric liner 120 may be formed of or comprise different materials, or include a same material having different compositions. For example, dielectric liner 120 may include a silicon oxide liner, and a silicon nitride liner over the silicon oxide liner, or may include two SiON layers having different nitrogen atomic percentages.

FIG. 8 further illustrates the deposition of conductive material 122. Conductive material 122 may be formed using PVD, CVD, plating, or the like. The respective process is illustrated as process 220 in the process flow 200 as shown in FIG. 28, conductive material 122 may be a single-layer material or may include a plurality of layers, which may include a barrier formed of TiN, TaN, or the like and a metallic material formed of copper, tungsten, cobalt, or the like, or combinations thereof.

FIG. 9 illustrates a planarization process, which may be a CMP process or a mechanical grinding process. The planarization process results in the planarization of the top surface of conductive material 122. The respective process is illustrated as process 222 in the process flow 200 as shown in FIG. 28. The remaining portions of conductive material 122 are referred to as through-vias 122' (also alternatively referred to as TSVs 122') hereinafter.

Figure 10:
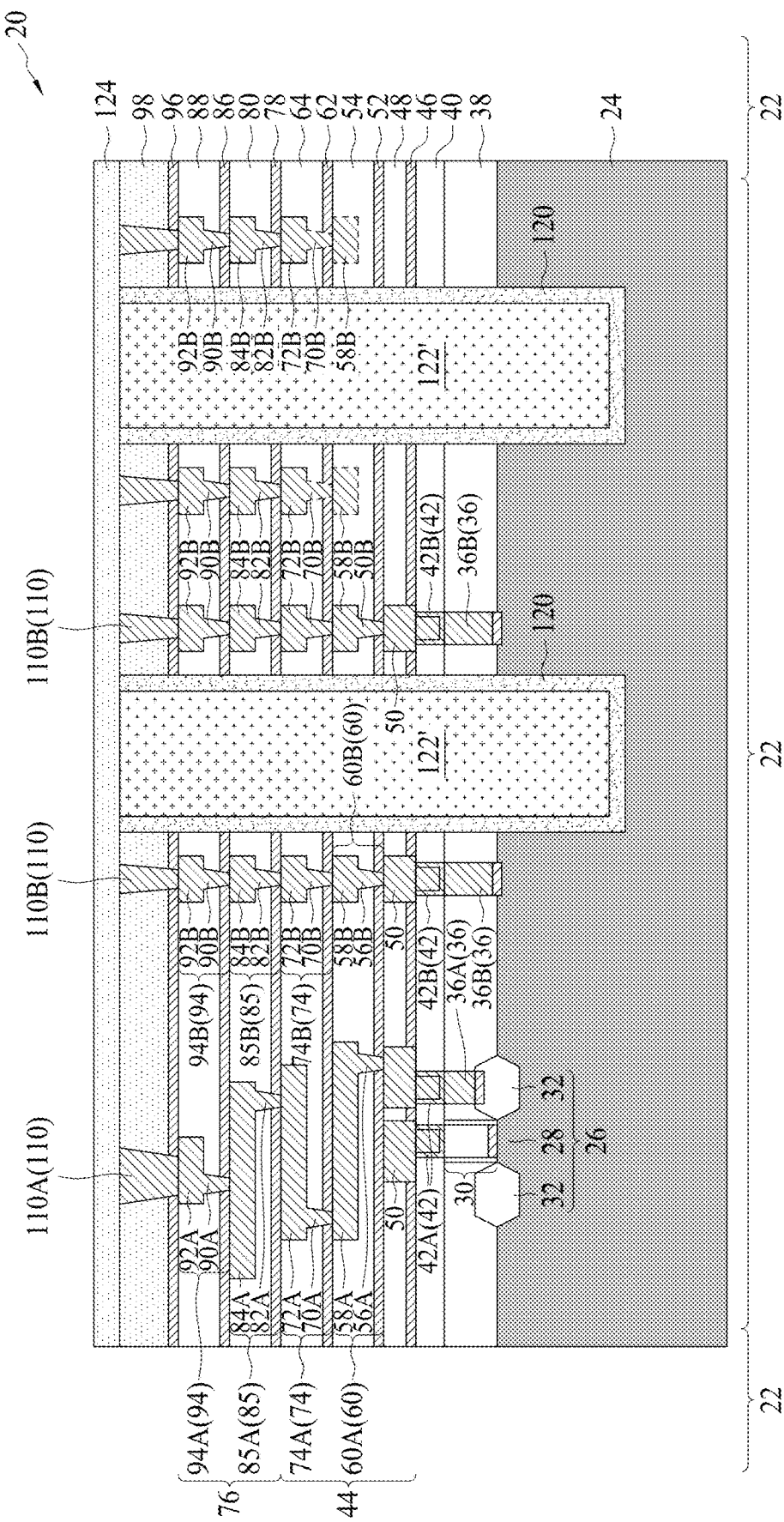
Figure 11:
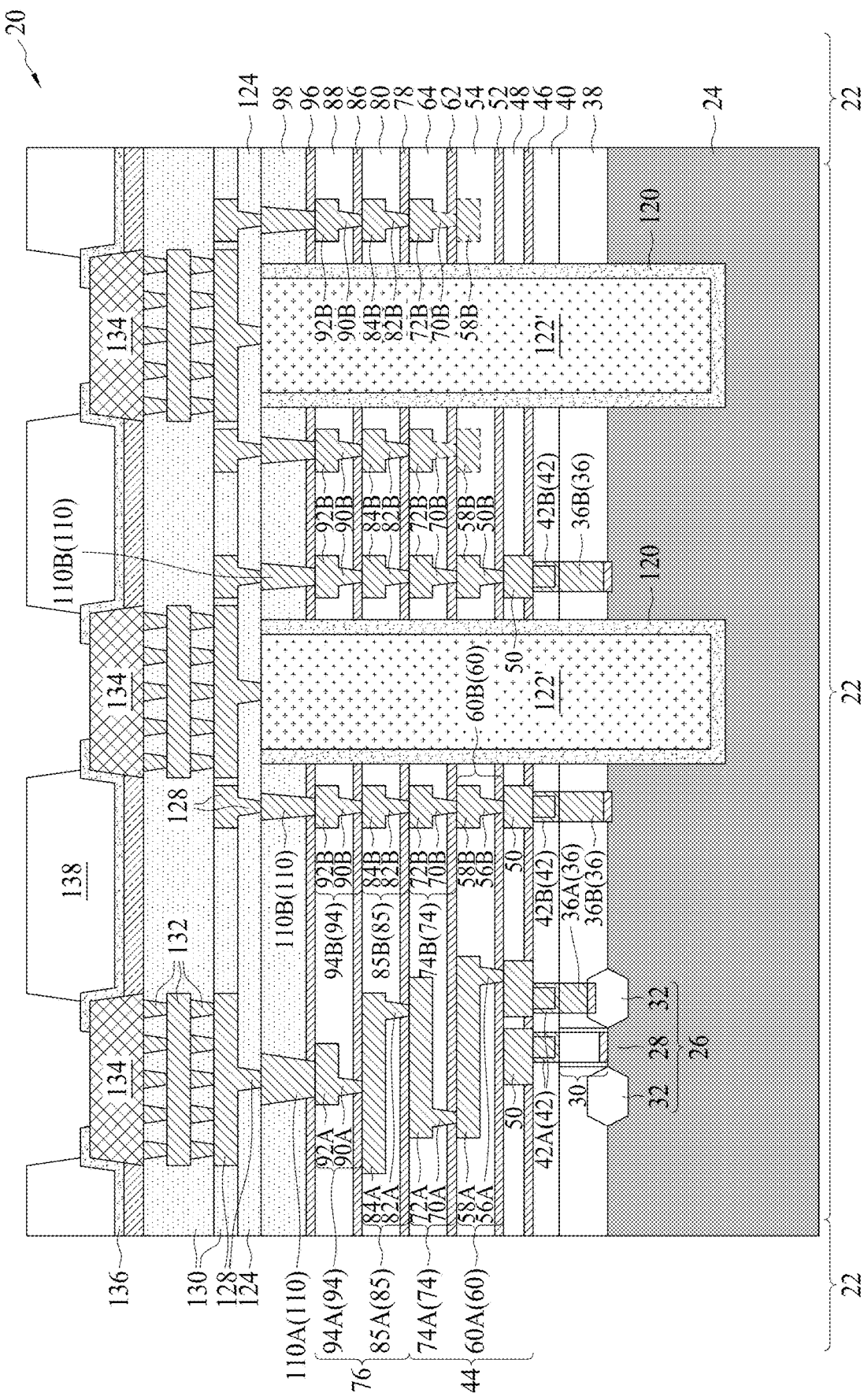
Figure 12:
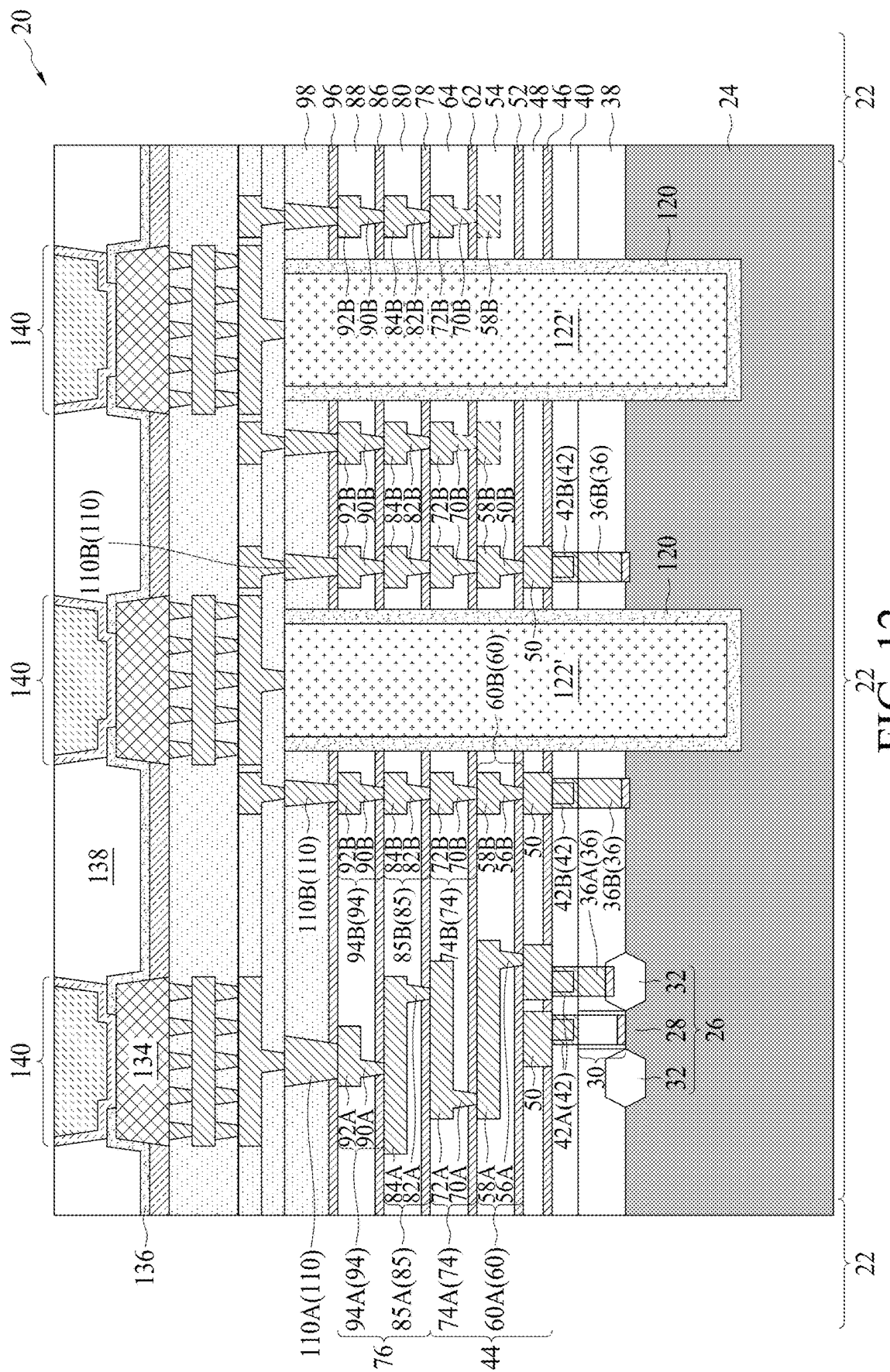

FIGS. 10 through 12 illustrate the formation of upper features in accordance with some embodiments. The respective process is illustrated as process 224 in the process flow 200 as shown in FIG. 28. It is appreciated that these processes are examples, and any other upper features with different structures and layers are contemplated by the present disclosure. Referring to FIG. 10, in accordance with some embodiments, isolation layer 124 is deposited. The material of isolation layer 124 may be selected from a dielectric such as silicon nitride, silicon oxide, silicon carbide, USG, or the like.

Isolation layer 124 is then etched, and conductive features 128 are formed to extend into isolation layer 124, and may also have some portions extending directly over isolation layer 124 in accordance with some embodiments. Conductive features 128 may comprise copper, tungsten, aluminum, or the like. A plurality of dielectric layers 130 are formed, and conductive features 132 are formed to connect to the electrical interconnection structure 113 and through-vias 122'. Metal pads 134 are then formed. Metal pads 134 may be aluminum pads or aluminum-copper pads, and other metallic materials may be used. The formation process may include depositing a metal layer, and then patterning the metal layer to leave conductive features metal pads 134.

Next, as also shown in FIG. 11, passivation layer 136 is deposited and patterned, so that some portions of passivation layer 136 cover the edge portions of metal pads 134, and some portions of metal pads 134 are exposed through the openings in passivation layer 136. Dielectric layer 138 is then formed, for example, using a silicon-containing dielectric material such as silicon oxide, silicon oxynitride, or the like. Bond pads 140 are formed in dielectric layer 138, may include copper, and the resulting structure is shown in FIG. 12.

Figure 13:
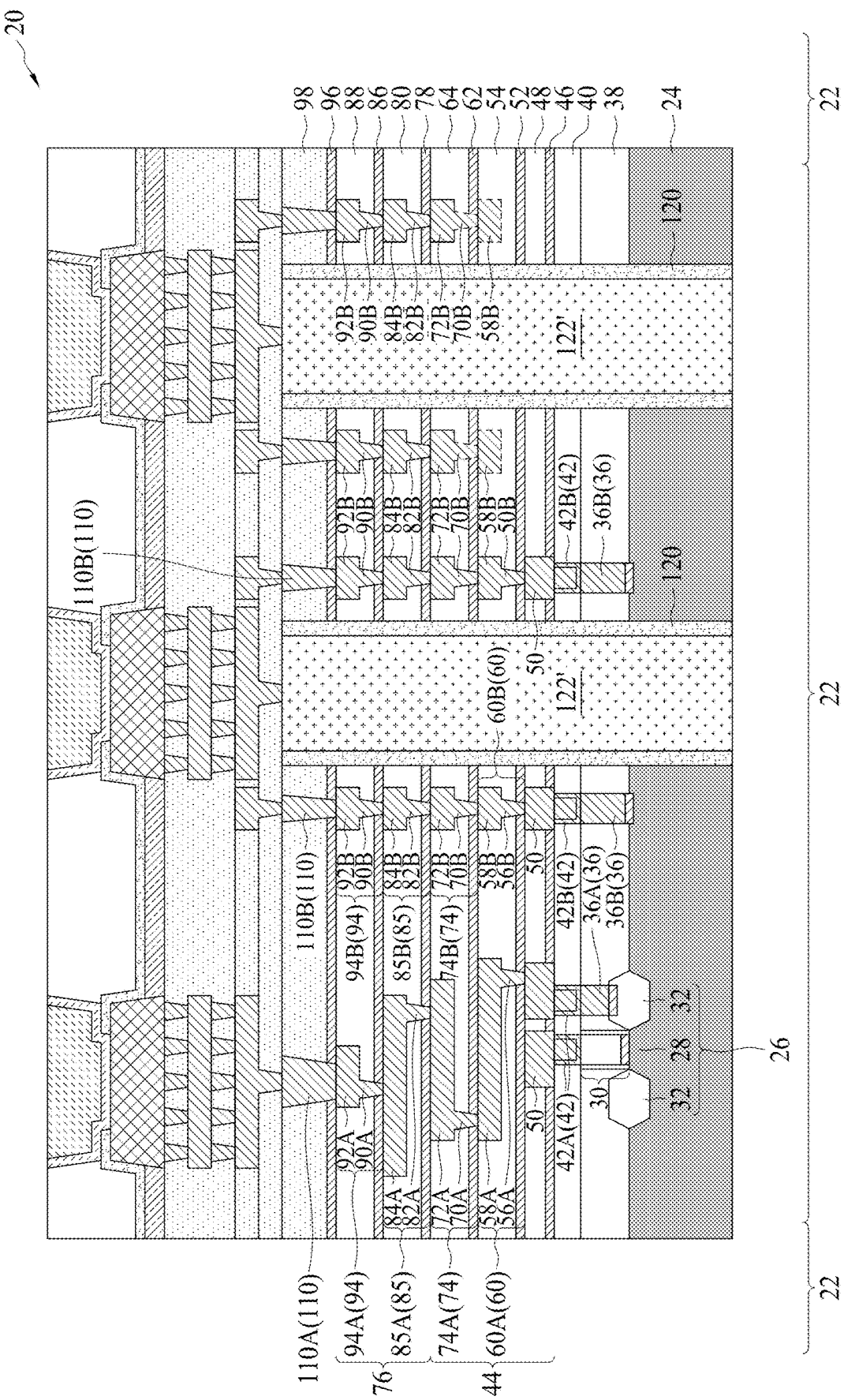
Figure 14:
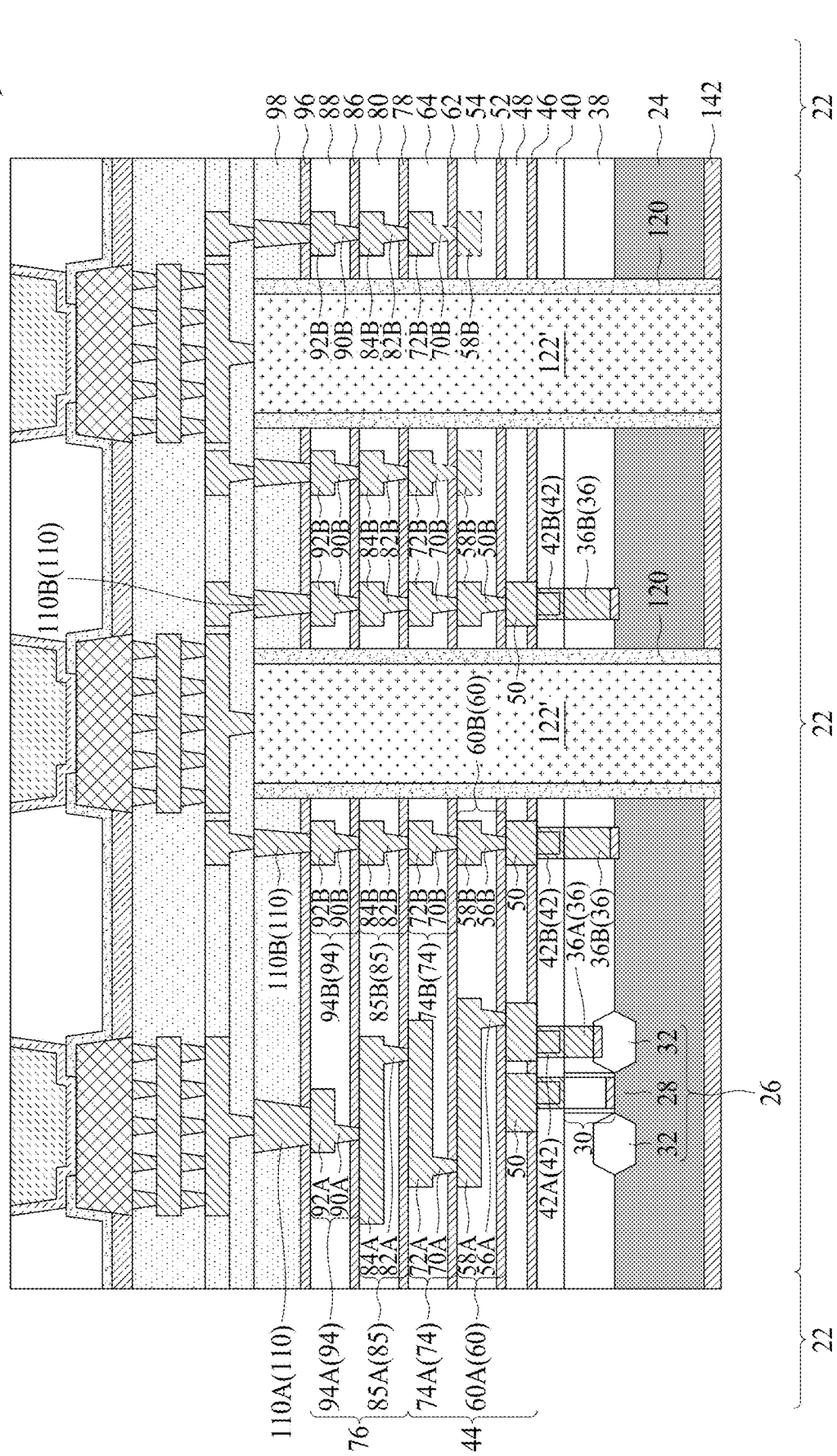
Figure 15:
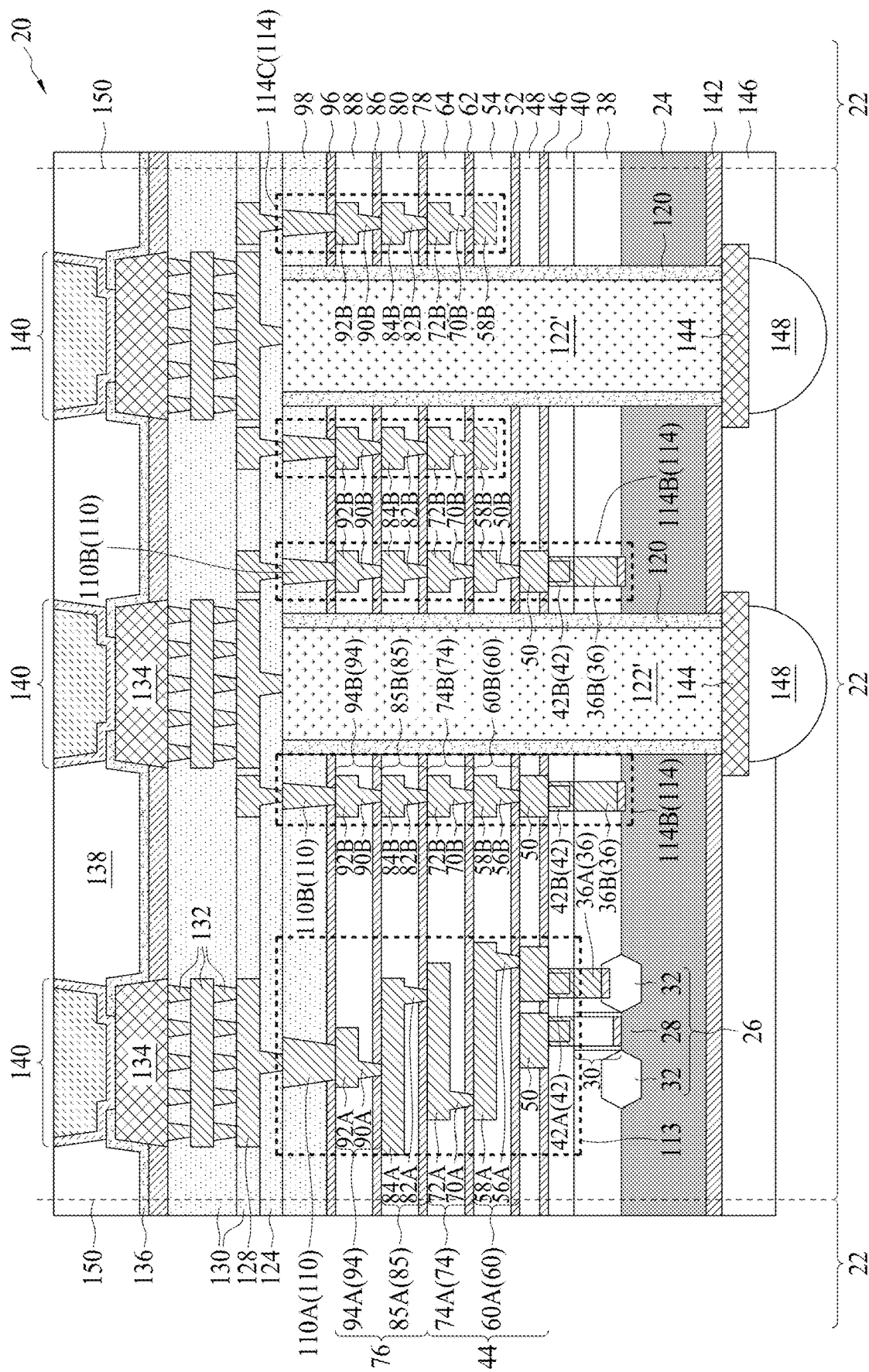

FIGS. 13 through 15 illustrate the process for forming features on the backside of semiconductor substrate 24. The respective process is illustrated as process 226 in the process flow 200 as shown in FIG. 28. Referring to FIG. 13, a backside grinding process is performed on the backside of semiconductor substrate 24 to remove a portion of substrate 24, until TSVs 122' are revealed. Next, semiconductor substrate 24 is recessed slightly (for example, through etching), so that TSVs 122' protrude out of the back surface of semiconductor substrate 24, as shown in FIG. 14.

Next, as also shown in FIG. 14, dielectric layer 142 is deposited, followed by a CMP process or a mechanical grinding process to re-expose TSVs 122'. TSVs 122' thus penetrate through dielectric layer 142 also. In accordance with some embodiments, dielectric layer 142 is formed of silicon oxide, silicon nitride, or the like.

Referring to FIG. 15, RDLs 144 may be then formed, which include pad portions contacting TSVs 122'. RDLs 144 may be formed of aluminum, copper, nickel, titanium, or the like in accordance with some embodiments. FIG. 15 further illustrates the formation of dielectric layer 146 and electrical connectors 148. In accordance with some embodiments, electrical connectors 148 include solder regions, which may be formed by plating or placing solder balls on the pads of RDLs 144, and reflowing the solder balls. In accordance with alternative embodiments, electrical connectors 148 are formed of non-solder metallic materials. For example, electrical connectors 148 may be formed as copper pads or pillars, and each may or may not include a nickel capping layer. Electrical connectors 148 may protrude out of the surrounding dielectric layer, and may be used for solder bonding or direct metal-to-metal bonding. Alternatively, the bottom surface of electrical connectors 148 may be coplanar with the bottom surface of dielectric layer 146, so that device die 22 may be used for hybrid bonding. Although one layer of RDLs 144 is shown in FIG. 15, RDLs 144 may include more than one metal layer in some embodiments.

In a subsequent process, wafer 20 may be singulated through a sawing process along scribe lines 150, and device dies 22 are separated from each other. The respective process is illustrated as process 228 in the process flow 200 as shown in FIG. 28.

Figure 16:
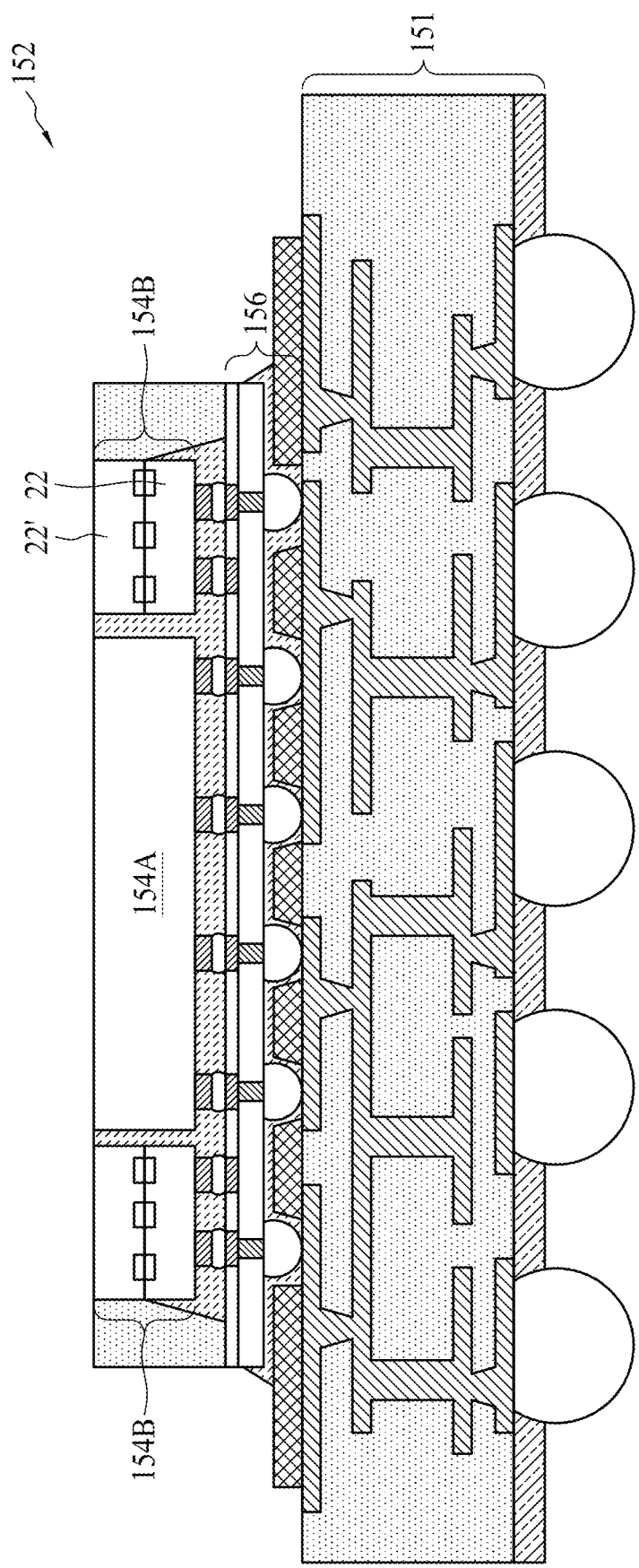
FIG. 16 illustrates a package incorporating the die in accordance with some embodiments.
Figure 17:
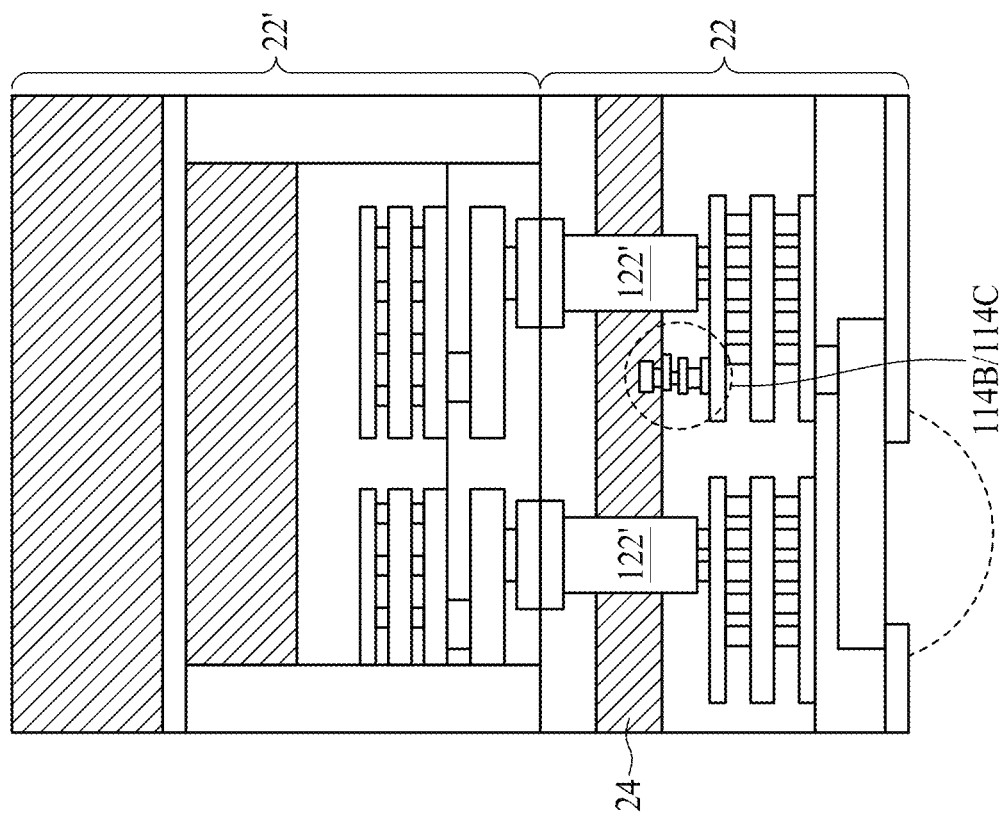
FIG. 17 illustrates a part of a package incorporating the die in accordance with some embodiments.

FIGS. 16 and 17 illustrate an example embodiment in which a die 22 as shown in FIG. 15 is used in a package. Referring to FIG. 16, package 152 includes package substrate 151, and interposer 156 over and bonded to package substrate 154. A plurality of device dies and/or packages are over and bonded to package substrate 151. The packages/device dies may include, for example, system-on-chip die 154A, and packages 154B. Packages 154B may also include device dies 22 and 22' bonded together by Cu—Cu bonding in some embodiments.

FIG. 17 illustrates an amplified view of a portion of device dies 22 and 22'. Device dies 22 and 22' may be bonded through hybrid bonding. Dummy stacked structures 114B or 114C is formed in device die 22. Although dummy stacked structures 114B or 114C are shown on the surface of the metal layer connecting to bump, dummy stacked structures 114B or 114C may be electrically floating in some embodiments.

FIGS. 18 through 27 illustrate the top views of dummy stacked structures 114 in accordance with some embodiments. It is appreciated that although different types of arrangements of dummy stacked structures 114 are shown in different figures, these dummy stacked structures 114 and the corresponding through-vias 122' may be formed in the same device die in any combination. Neighboring ones of the dummy stacked structures 114 may have substantially equal distances or different distances from each other.

Figure 19:
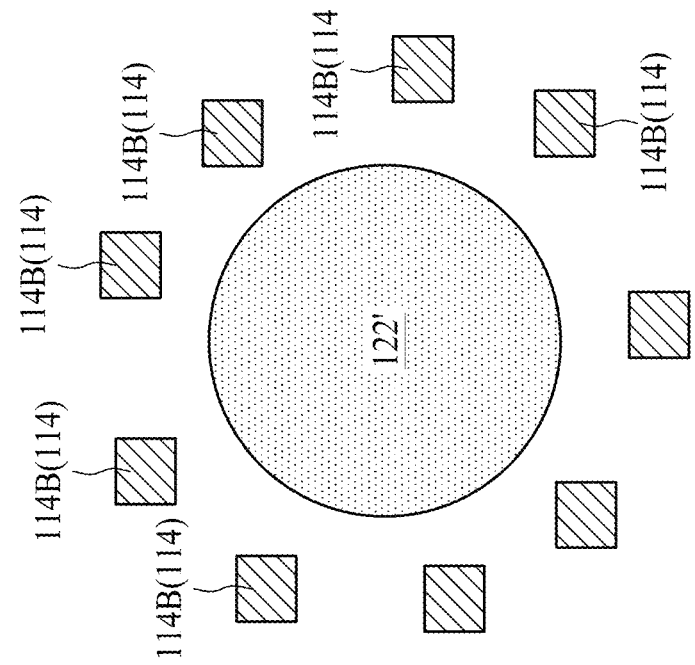
Figure 18:
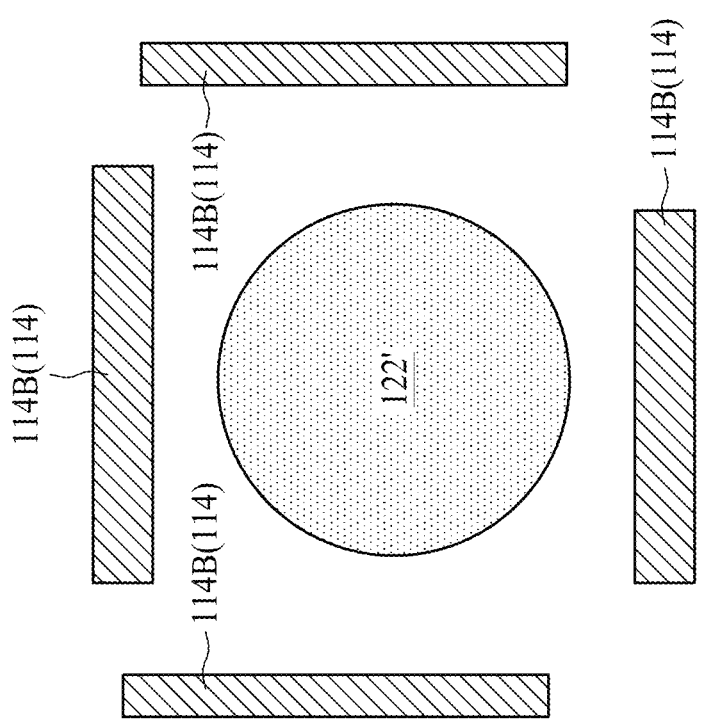

FIGS. 18 through 20 illustrate the top views of dummy stacked structures 114, which may be full dummy stacked structures 114B in accordance with some embodiments. The plurality of dummy stacked structures 114 may include full dummy stacked structures 114B, which may extend to semiconductor substrate 24. The ratio $TA_{FD}/TA_{TSV}$, which is the ratio of the total area $TA_{FD}$ of the full dummy stacked structures 114B to the top-view area $TA_{TSV}$ of the corresponding TSV 122', may be equal to or greater than about 1, and may be in the range between about 1 and 2.

Referring to FIG. 18, a plurality of dummy stacked structures 114 are arranged surrounding through-via 122'. The plurality of dummy stacked structures 114 are elongated, and are arranged aligning to a ring encircling through-via 122'. For example, the elongated dummy stacked structures 114 may have length-to-width ratios greater than about 2, or greater than 5. FIG. 19 illustrates a plurality of dummy stacked structures 114 in accordance with some embodiments in which the plurality of dummy stacked structures 114 are non-elongated. Dummy stacked structures 114 may have square top-view shapes, circular top-view shapes, or rectangular shapes with length-to-width ratios smaller than about 2. FIG. 20 illustrates a plurality of dummy stacked structures 114 in accordance with some embodiments, in which the plurality of dummy stacked structures 114 include the mixture of elongated and non-elongated dummy stacked structures.

Figure 22:
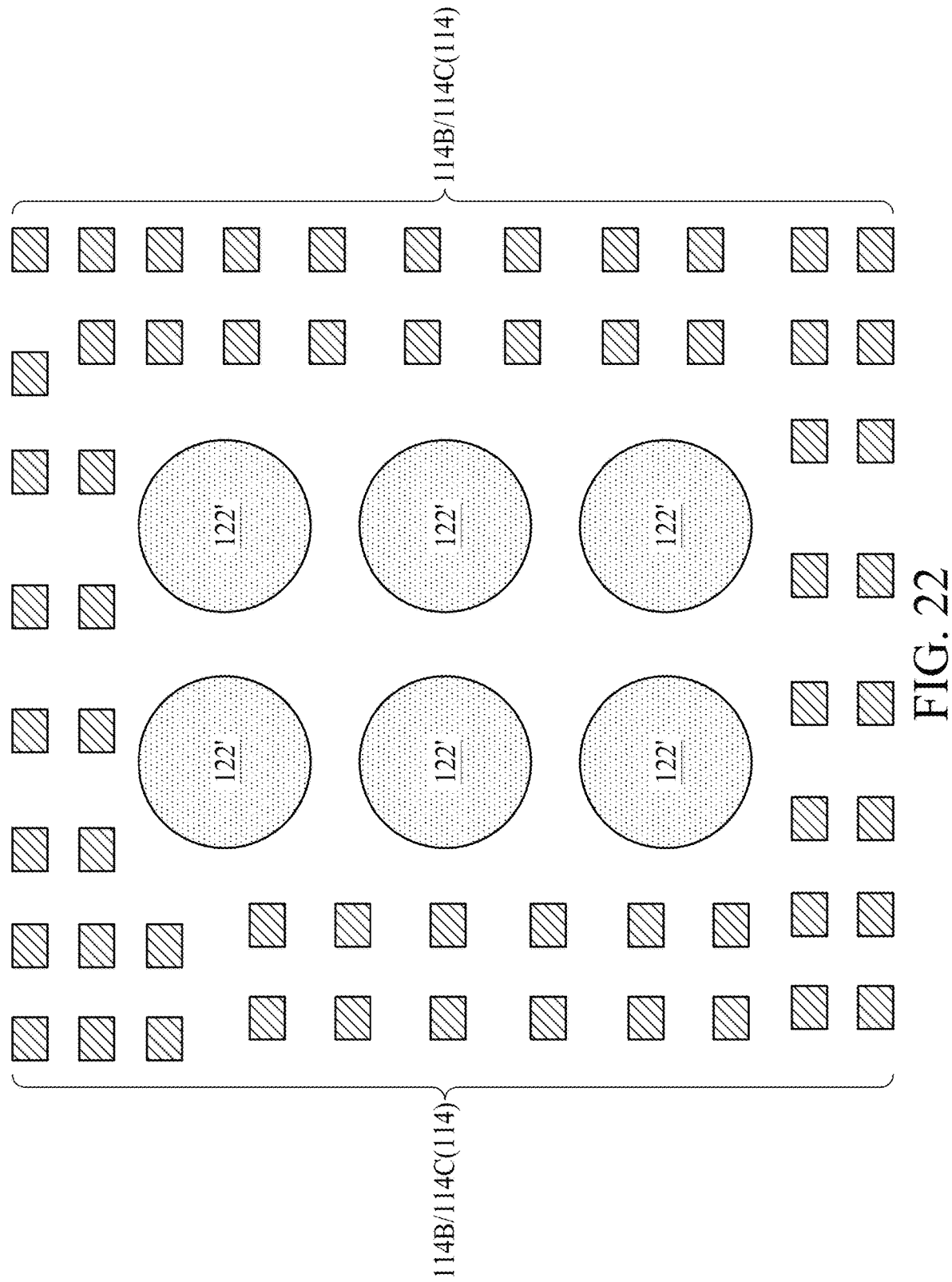

FIGS. 21 and 22 illustrate the top views of dummy stacked structures 114, which may be partial dummy stacked structures 114C in accordance with some embodiments. Full dummy stacked structures 114B may also adopt these structures, and hence the notation "114B/114C/(114)" is denoted. The plurality of dummy stacked structures 114 surrounding a through-via 122' are laid out aligning to two or more rings, with outer rings enclosing the corresponding inner rings. These embodiments may be applied when partial dummy stacked structures 114C are used, although these embodiments may also be applied to full dummy stacked structures 114B also. Since partial dummy stacked structures 114C are less effective in outgassing and blocking moisture, increasing the number of partial dummy stacked structures 114C may compensate for the reduced effect. In accordance with some embodiments, the ratio $TA_{PD}/TA_{TSV}$, which is the total area $TA_{PD}$ of the partial dummy stacked structures 114C surrounding a TSV 122' to the top-view area $TA_{TSV}$ of TSV 122', may be greater than 2, and may be in the range between about 2 and about 3. FIGS. 21 and 22 are similar to each other, except that FIG. 21 illustrates that dummy stacked structures 114 are arranged aligning to circular rings, while FIG. 22 illustrates that dummy stacked structures 114 are arranged aligning to rectangular rings.

Figure 23:
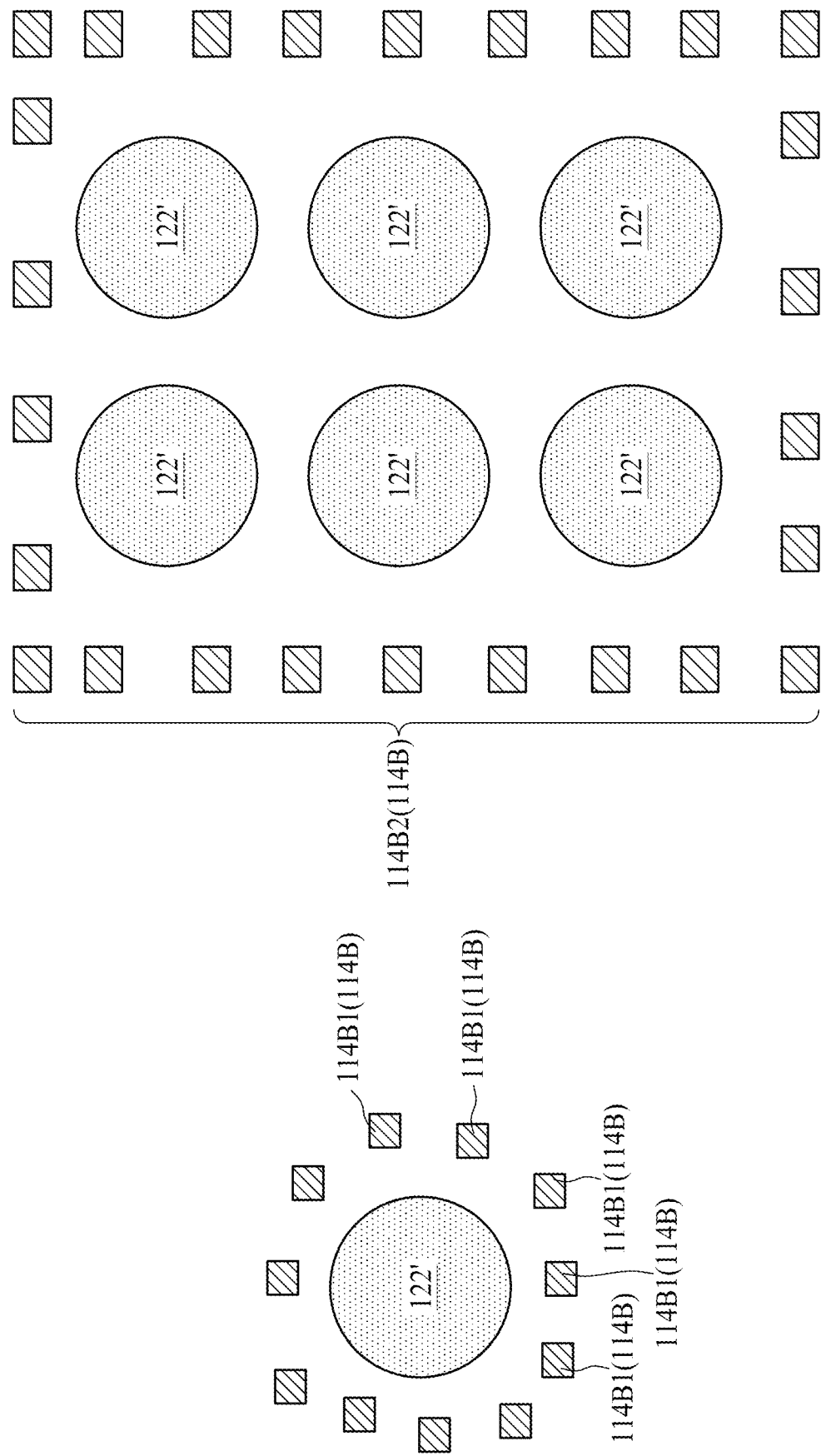

FIG. 23 illustrates an embodiment wherein full dummy stacked structures 114B (marked as 114B1) encircle a single through-via 122', and other full dummy stacked structures 114B (marked as 114B2) encircle a plurality of through-vias 122'. In accordance with some embodiments, a ratio of the total area of dummy stacked structures 114B1 to the total area of dummy stacked structures 114B2 is equal to or smaller than about 1.

Figure 24:
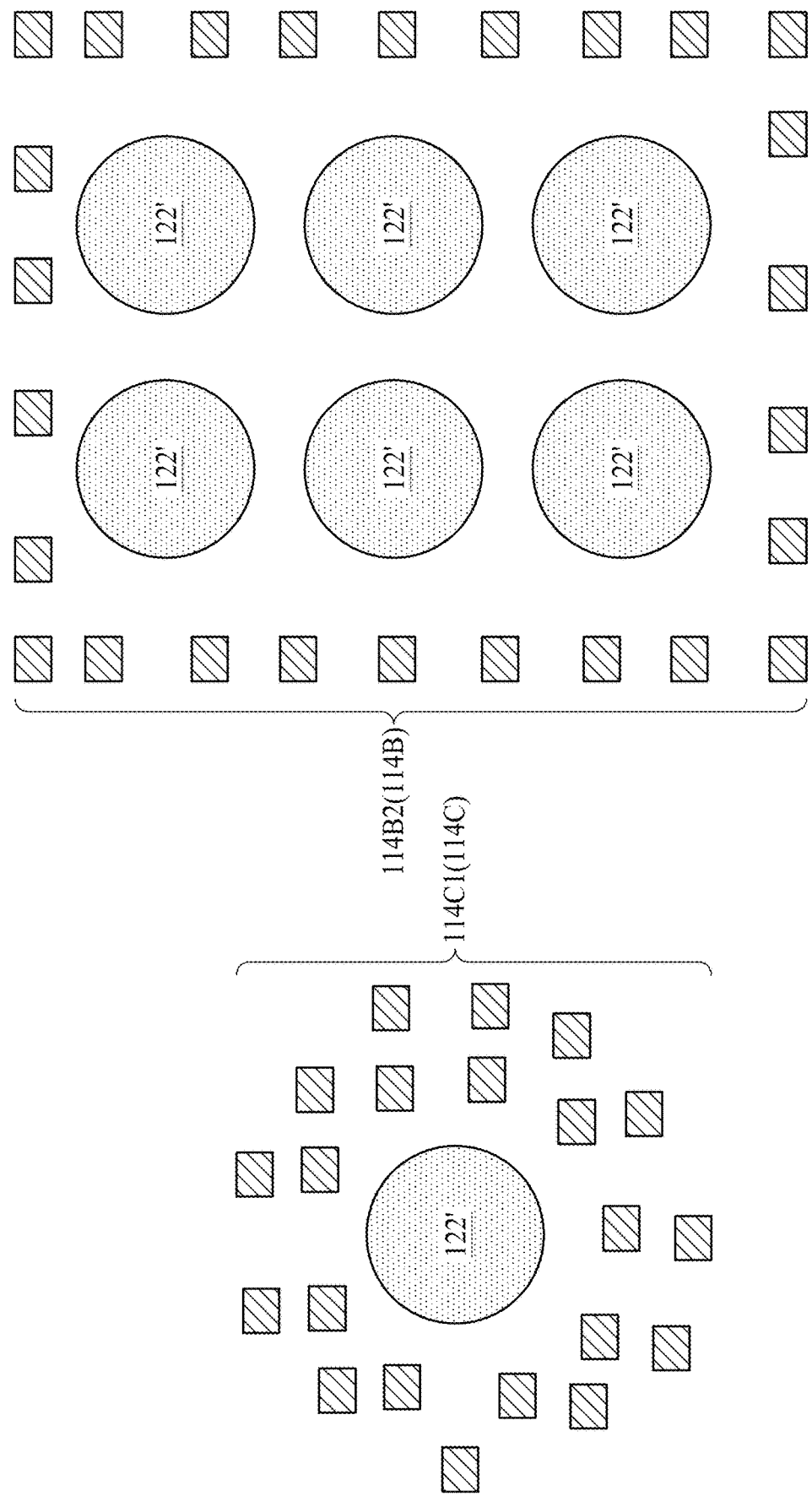

FIG. 24 illustrates an embodiment wherein partial dummy stacked structures 114C (marked as 114C1) encircle a single through-via 122', and other full dummy stacked structures 114B (marked as 114B2) encircle a plurality of through-vias 122'. In accordance with some embodiments, a ratio of the total area of dummy stacked structures 114C1 to the total area of dummy stacked structures 114B2 is greater than about 2, and may be in the range between about 2 and about 3.

Figure 25:
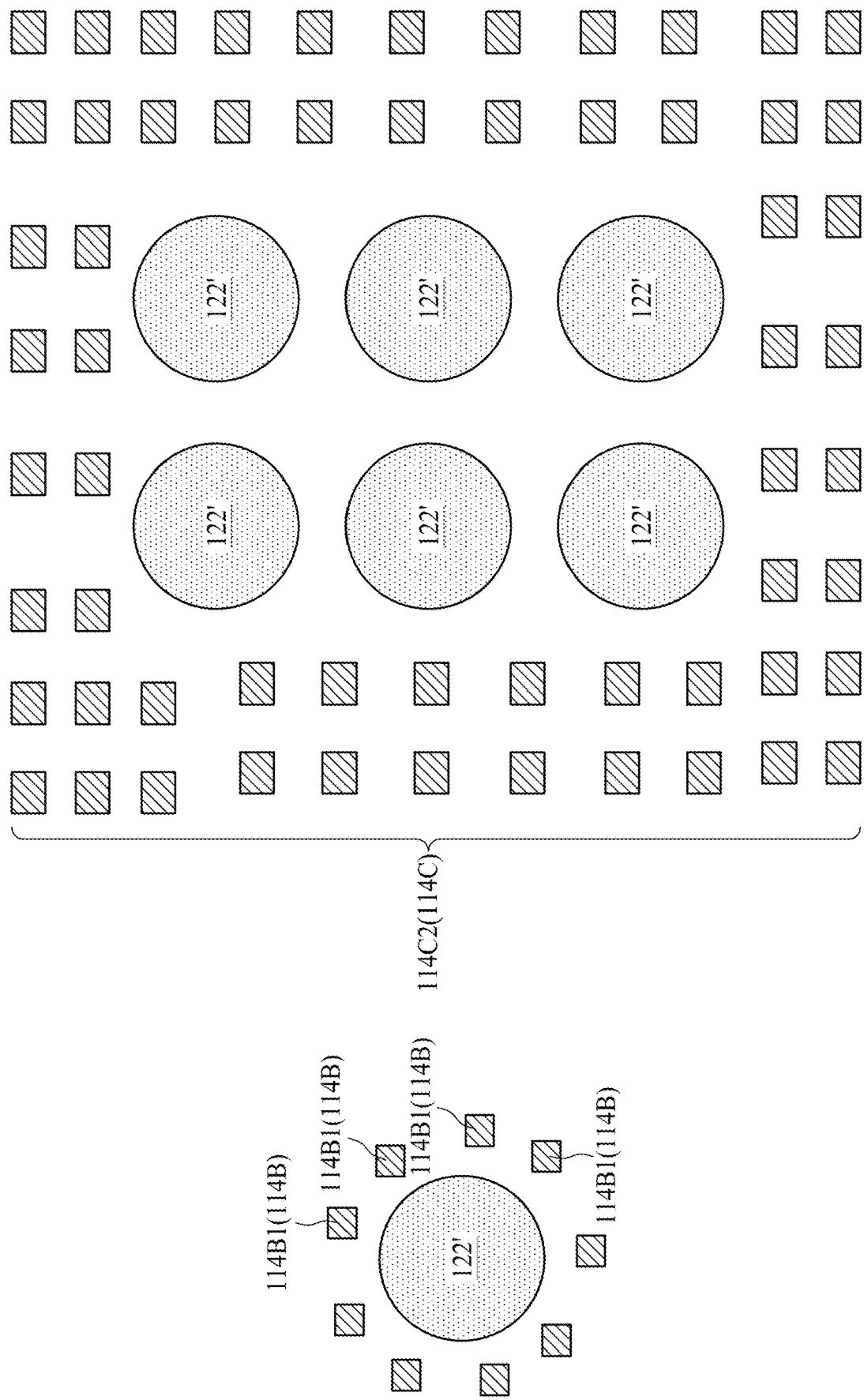

FIG. 25 illustrates an embodiment wherein full dummy stacked structures 114B (marked as 114B1) encircle a single through-via 122', and other partial dummy stacked structures 114C (marked as 114C2) encircle a plurality of through-vias 122'. In accordance with some embodiments, a ratio of the total area of partial dummy stacked structures 114C2 to the total area of dummy stacked structures 114B1 is greater than about 2, and may be in the range between about 2 and about 3.

Figure 27:
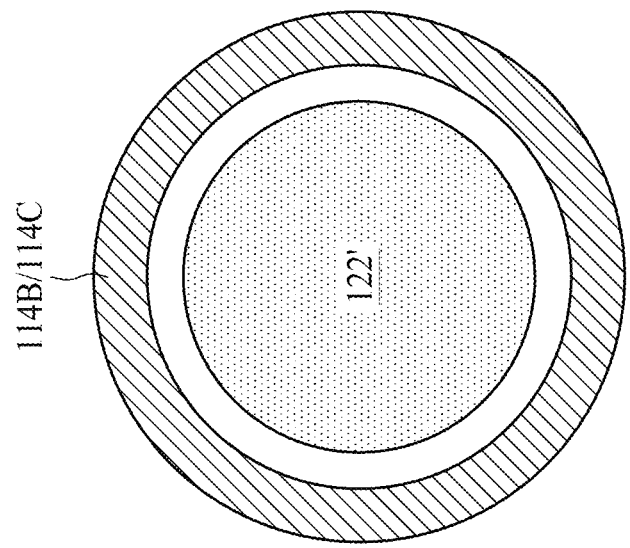
Figure 26:
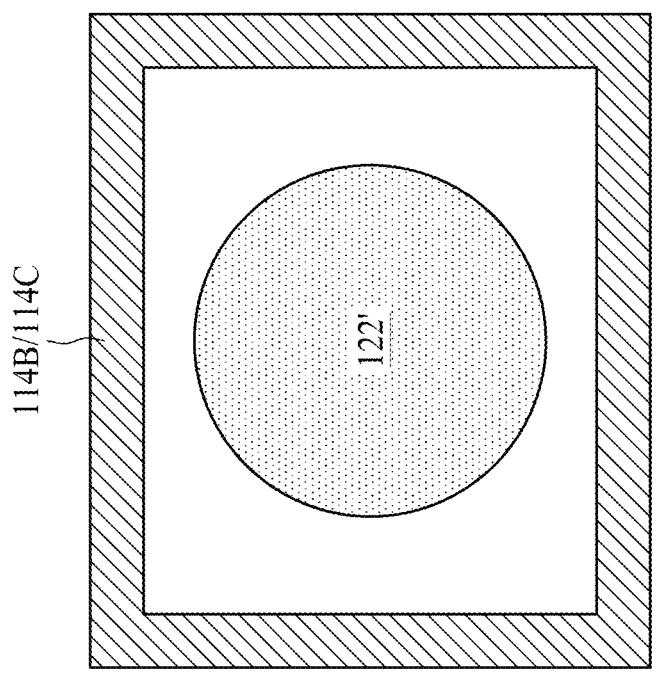

FIGS. 26 and 27 illustrate dummy stacked structures 114 (which may be full dummy stacked structures 114B or partial dummy stacked structures 114C) form enclosed rings. In FIG. 26, a circular ring is shown. In FIG. 27, a rectangular ring is shown. Similarly, when the dummy stacked structure 114 is a full dummy stacked structure, there may be a single ring encircling a through-via 122'. When dummy stacked structures 114 are partial dummy stacked structures, there may be two or more rings encircling the corresponding through-via 122', with the outer ring encircling the corresponding inner ring(s).

The embodiments of the present disclosure have some advantageous features. By forming dummy stacked structures around TSVs, the dummy stacked structures may act as the moisture-outgassing channels and moisture-blocking features. Accordingly, less moisture may remain in dielectric layers, and the dielectric degradation caused by the moisture is reduced.

In accordance with some embodiments of the present disclosure, a method comprises forming a plurality of low-k dielectric layers over a semiconductor substrate; forming a first plurality of dummy stacked structures extending into at least one of the plurality of low-k dielectric layers; forming a plurality of non-low-k dielectric layers over the plurality of low-k dielectric layers; forming a second plurality of dummy stacked structures extending into the plurality of non-low-k dielectric layers, wherein the second plurality of dummy stacked structures are over and connected to corresponding ones of the first plurality of dummy stacked structures; etching the plurality of non-low-k dielectric layers, the plurality of low-k dielectric layers, and the semiconductor substrate to form an opening, wherein the opening is encircled by the first plurality of dummy stacked structures and the second plurality of dummy stacked structures; and filling the via opening to form a through-via. In an embodiment, the first plurality of dummy stacked structures comprise a plurality of portions in one of the plurality of low-k dielectric layers, and the plurality of portions are disconnected from each other. In an embodiment, the method further comprises forming an integrated circuit at a surface of the semiconductor substrate; and forming a plurality of electrical connection structures electrically coupling to the integrated circuit, wherein the plurality of electrical connection structures are formed in same processes as the first plurality of dummy stacked structures and the second plurality of dummy stacked structures. In an embodiment, the first plurality of dummy stacked structures and the second plurality of dummy stacked structures are electrically floating. In an embodiment, the first plurality of dummy stacked structures and the second plurality of dummy stacked structures are spaced apart from the via opening by spacings smaller than about 1 µm. In an embodiment, the first plurality of dummy stacked structures extend to the semiconductor substrate. In an embodiment, bottoms of the first plurality of dummy stacked structures are higher than, and are spaced apart from, the semiconductor substrate. In an embodiment, the first plurality of dummy stacked structures form a plurality of rings, each fully encircling the via opening. In an embodiment, the method further comprises performing a baking process on a respective wafer comprising the via opening.

In accordance with some embodiments of the present disclosure, a structure comprises a semiconductor substrate; a plurality of dielectric layers over the semiconductor substrate; a first through-via penetrating through the semiconductor substrate and the plurality of dielectric layers; and a first plurality of dummy stacked structures in the plurality of dielectric layers, wherein the first plurality of dummy stacked structures are adjacent to and encircle the first through-via. In an embodiment, the first plurality of dummy stacked structures are electrically floating. In an embodiment, the first plurality of dummy stacked structures are distributed surrounding the first through-via, with neighboring ones of the first plurality of dummy stacked structures have substantially equal distances. In an embodiment, the plurality of dielectric layers comprise a plurality of low-k dielectric layers; and a plurality of non-low-k dielectric layers over the plurality of low-k dielectric layers, wherein the first plurality of dummy stacked structures penetrate through the plurality of non-low-k dielectric layers, and extend into at least one of the plurality of low-k dielectric layers. In an embodiment, the first plurality of dummy stacked structures penetrate through all of the plurality of low-k dielectric layers, and extend to the semiconductor substrate. In an embodiment, the structure further comprises a second through-via penetrating through the semiconductor substrate and the plurality of dielectric layers; and a second plurality of dummy stacked structures in the plurality of dielectric layers, wherein the second plurality of dummy stacked structures are adjacent to and encircle the second through-via, and wherein the second plurality of dummy stacked structures has bottom portions in one of the plurality of low-k dielectric layers, and the bottom portions are vertically spaced apart from the semiconductor substrate. In an embodiment, the first plurality of dummy stacked structures stop in one of the plurality of dielectric layers, and are vertically spaced apart from the semiconductor substrate. In an embodiment, spacings from the first plurality of dummy stacked structures to the first through-via are smaller than about 1 µm.

In accordance with some embodiments of the present disclosure, a structure comprises a semiconductor substrate; a plurality of low-k dielectric layers over the semiconductor substrate; a plurality of non-low-k dielectric layers over the plurality of low-k dielectric layers; a dummy stacked structure penetrating through the plurality of non-low-k dielectric layers, and further extending into at least one of the plurality of low-k dielectric layers, wherein the dummy stacked structure is electrically floating; and a through-via adjacent to the dummy stacked structure, wherein the through-via penetrates through the plurality of non-low-k dielectric layers; the plurality of low-k dielectric layers; and the semiconductor substrate. In an embodiment, the structure further comprises a plurality of dummy stacked structures that are electrically floating, wherein the plurality of dummy stacked structures and the dummy stacked structure are aligned to a ring encircling the through-via. In an embodiment, the dummy stacked structure penetrates through all of the plurality of non-low-k dielectric layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure comprising:
a semiconductor substrate;
a plurality of dielectric layers over the semiconductor substrate;
a first through-via penetrating through the semiconductor substrate and the plurality of dielectric layers; and
a first plurality of dummy stacked structures in the plurality of dielectric layers, wherein the first plurality of dummy stacked structures are adjacent to and encircle the first through-via.

2. The structure of claim 1, wherein the first plurality of dummy stacked structures are electrically floating.

3. The structure of claim 1, wherein neighboring ones of the first plurality of dummy stacked structures have substantially equal distances.

4. The structure of claim 1, wherein the plurality of dielectric layers comprise:
a plurality of low-k dielectric layers; and
a plurality of non-low-k dielectric layers over the plurality of low-k dielectric layers, wherein the first plurality of dummy stacked structures penetrate through the plurality of non-low-k dielectric layers, and extend into at least one of the plurality of low-k dielectric layers.

5. The structure of claim 4, wherein the first plurality of dummy stacked structures penetrate through all of the plurality of low-k dielectric layers, and extend to the semiconductor substrate.

6. The structure of claim 4 further comprising:
a second through-via penetrating through the semiconductor substrate and the plurality of dielectric layers; and
a second plurality of dummy stacked structures in the plurality of dielectric layers, wherein the second plurality of dummy stacked structures are adjacent to and encircle the second through-via, and wherein the second plurality of dummy stacked structures have bottom portions in one of the plurality of low-k dielectric layers, and the bottom portions are vertically spaced apart from the semiconductor substrate.

7. The structure of claim 1, wherein the first plurality of dummy stacked structures have bottom ends vertically spaced apart from the semiconductor substrate.

8. The structure of claim 1, wherein spacings from the first plurality of dummy stacked structures to the first through-via are smaller than about 1 µm.

9. A structure comprising:
a semiconductor substrate;
a plurality of dielectric layers over the semiconductor substrate, wherein the plurality of dielectric layers comprise:
 a plurality of low-k dielectric layers; and
 a plurality of non-low-k dielectric layers over the plurality of low-k dielectric layers;
a first through-via penetrating through the semiconductor substrate and the plurality of dielectric layers; and
a first plurality of dummy stacked structures in the plurality of dielectric layers, wherein the first plurality of dummy stacked structures are adjacent to and are aligned to a feature that encircles the first through-via, and wherein the first plurality of dummy stacked structures penetrate through the plurality of non-low-k dielectric layers, and extend into at least one of the plurality of low-k dielectric layers.

10. The structure of claim 9, wherein the first plurality of dummy stacked structures are electrically floating.

11. The structure of claim 9, wherein neighboring ones of the first plurality of dummy stacked structures have substantially equal distances.

12. The structure of claim 9, wherein the first plurality of dummy stacked structures further comprise portions extending to the semiconductor substrate.

13. The structure of claim 9 further comprising:
a second through-via penetrating through the semiconductor substrate and the plurality of dielectric layers; and
a second plurality of dummy stacked structures in the plurality of dielectric layers, wherein the second plurality of dummy stacked structures are adjacent to and encircle the second through-via, and wherein the second plurality of dummy stacked structures have bottom portions in one of the plurality of low-k dielectric layers, and the bottom portions are vertically spaced apart from the semiconductor substrate.

14. A structure comprising:
a semiconductor substrate;
a plurality of dielectric layers over the semiconductor substrate, wherein the plurality of dielectric layers comprise:
 a plurality of low-k dielectric layers; and
 a plurality of non-low-k dielectric layers over the plurality of low-k dielectric layers;
a through-via penetrating through the semiconductor substrate and the plurality of dielectric layers; and
a plurality of dummy stacked structures in the plurality of dielectric layers, wherein the plurality of dummy stacked structures are adjacent to and encircle the through-via, wherein the plurality of dummy stacked structures are at least partially disposed in the plurality of non-low-k dielectric layers and at least one of the plurality of low-k dielectric layers.

15. The structure of claim 14, wherein the plurality of dummy stacked structures are electrically floating.

16. The structure of claim 14, wherein a portion of the through-via is higher than some portions of the plurality of dummy stacked structures.

17. The structure of claim 14, wherein the plurality of dummy stacked structures extend to the semiconductor substrate.

18. The structure of claim 14, wherein the plurality of dummy stacked structures have bottom ends vertically spaced apart from the semiconductor substrate.

19. The structure of claim 1, wherein the first plurality of dummy stacked structures encircle, and are spaced apart from, the first through-via in a top view of the structure.

20. The structure of claim 1, wherein in a top view of the structure, neighboring ones of the first plurality of dummy stacked structures are substantially evenly distributed.

\* \* \* \* \*